US011877488B2

(12) United States Patent
Chen et al.

(10) Patent No.: US 11,877,488 B2
(45) Date of Patent: Jan. 16, 2024

(54) DISPLAY PANEL, DRIVING METHOD AND DISPLAY DEVICE

(71) Applicant: BOE Technology Group Co., Ltd., Beijing (CN)

(72) Inventors: Yipeng Chen, Beijing (CN); Ling Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/631,401

(22) PCT Filed: Apr. 8, 2021

(86) PCT No.: PCT/CN2021/085943
§ 371 (c)(1),
(2) Date: Jan. 28, 2022

(87) PCT Pub. No.: WO2021/232984
PCT Pub. Date: Nov. 25, 2021

(65) Prior Publication Data

US 2022/0336573 A1 Oct. 20, 2022

(30) Foreign Application Priority Data

May 22, 2020 (CN) ......................... 202010441682.5

(51) Int. Cl.
*H10K 59/179* (2023.01)
*G09G 3/3216* (2016.01)
(Continued)

(52) U.S. Cl.
CPC ......... *H10K 59/179* (2023.02); *G09G 3/3216* (2013.01); *G09G 3/3233* (2013.01);
(Continued)

(58) Field of Classification Search
CPC .. G09G 3/3233; G09G 3/3216; G09G 3/3208; G09G 2300/0426;
(Continued)

(56) References Cited

U.S. PATENT DOCUMENTS 10,360,432 B1 7/2019 He et al.
2017/0194416 A1* 7/2017 Chen .................. H01L 51/5234
(Continued)

FOREIGN PATENT DOCUMENTS

CN 107610635 A 1/2018
CN 108269835 A 7/2018
(Continued)

OTHER PUBLICATIONS

Machined English Translation for CN 110690261 A; Jan. 20, 2023; pp. 1-12 (Year: 2023).*

*Primary Examiner* — Jimmy H Nguyen
(74) *Attorney, Agent, or Firm* — IPro, PLLC

(57) ABSTRACT

A display panel, driving method and display device, where the display panel includes: a substrate (100) that includes a first display area (A1) and a second display area (A2); a pixel circuit layer positioned in the second display area (A2) of the substrate (100) and including multiple pixel circuits; a light-emitting device layer positioned on one side of the pixel circuit layer that is away from the substrate (100) and including multiple active light-emitting devices (120) and multiple passive light-emitting devices (130), where the multiple active light-emitting devices (120) are arranged in the second display area (A2) and each of the pixel circuits is electrically connected to at least one active light-emitting device (120), and the multiple passive light-emitting devices (130) are arranged in an array in the first display area (A1).

18 Claims, 11 Drawing Sheets

A2 030 020 140 142 141 A1 010 040 050-2 PX2 060 050-1 A A' B B' F1 F2

(51) Int. Cl.
*G09G 3/3233* (2016.01)
*H10K 50/822* (2023.01)
*H10K 59/131* (2023.01)
*H10K 59/35* (2023.01)

(52) U.S. Cl.
CPC ......... *H10K 50/822* (2023.02); *H10K 59/131* (2023.02); *G09G 2300/0465* (2013.01); *G09G 2310/0221* (2013.01); *G09G 2310/08* (2013.01); *G09G 2320/0233* (2013.01); *H10K 59/35* (2023.02)

(58) Field of Classification Search
CPC ... G09G 2300/0465; G09G 2300/0452; G09G 2310/08; G09G 2310/0221; G09G 2320/0233; G09G 2340/0407; H01L 27/3288; H01L 27/3276; H01L 27/3211; H01L 51/5225; H10K 59/179; H10K 59/131; H10K 59/35; H10K 50/822
USPC .................................................... 345/694, 76
See application file for complete search history.

(56) References Cited

U.S. PATENT DOCUMENTS

2017/0338293 A1* 11/2017 Guo ........................ H01L 21/77
2020/0052059 A1* 2/2020 Chen .................. H01L 27/3276
2020/0135972 A1 4/2020 Ma et al.
2020/0251539 A1 8/2020 Fu
2021/0020706 A1 1/2021 Chen
2022/0045299 A1 2/2022 Liu et al.

FOREIGN PATENT DOCUMENTS

CN 109801950 A 5/2019
CN 110265472 A 9/2019
CN 110690261 A * 1/2020 ......... H01L 27/3225
CN 110767687 A 2/2020
CN 110767697 A 2/2020
CN 110783484 A 2/2020
CN 111584591 A 8/2020
WO 2019104843 A1 6/2019

* cited by examiner

DISPLAY PANEL, DRIVING METHOD AND DISPLAY DEVICE

CROSS REFERENCE TO RELATED APPLICATIONS

The present application is a US National Stage of International Application No. PCT/CN2021/085943, filed on Apr. 8, 2021, which claims priority to the Chinese Patent Application No. 202010441682.5, filed to the China Patent Office on May 22, 2020 and entitled "DISPLAY PANEL, DRIVING METHOD AND DISPLAY APPARATUS", the entire contents of which are incorporated herein by reference.

FIELD

The present disclosure relates to the technical field of display, in particular to a display panel, a driving method and a display apparatus.

BACKGROUND

With soaring development of a display technology, a screen-to-body ratio of a display product is gradually increased. However, a front camera, a sensor and other elements need to be arranged in a display product such as a mobile phone, which is disadvantageous for design of a full screen.

SUMMARY

A display panel provided by an embodiment of the present disclosure, includes:

a base substrate, including a first display region and a second display region;

a pixel circuit layer, located in the second display region of the base substrate and including a plurality of pixel circuits; and a light-emitting device layer, located on one side, facing away from the base substrate, of the pixel circuit layer; where the light-emitting device layer includes a plurality of active light-emitting devices and a plurality of passive light-emitting devices, the plurality of active light-emitting devices are arranged in the second display region, and each of the pixel circuits is electrically connected with at least one of the active light-emitting devices; and the plurality of passive light-emitting devices are arranged in the first display region in an array mode;

where the first display region includes: a plurality of first sub-display regions which are configured to be driven separately to make the first display region display an image.

Optionally, in the embodiment of the present disclosure, each of the first sub-display regions further includes: a plurality of first driving lines and a plurality of second driving lines, where cathodes of passive light-emitting devices in one column are electrically connected with one of the first driving lines; anodes of the passive light-emitting devices in one row are electrically connected with one of the second driving lines; and the second driving lines in different first sub-display regions are arranged at intervals.

Optionally, in the embodiment of the present disclosure, the first display region includes a plurality of first pixel units arranged in an array mode, where the first pixel units include first color sub-pixels, second color sub-pixels and third color sub-pixels; and, one of the passive light-emitting devices is arranged in each of the first color sub-pixels, the second color sub-pixels and the third color sub-pixels in the first display region respectively;

anodes of the passive light-emitting devices in the same color sub-pixel in one row are electrically connected with one of the second driving lines; cathodes of the passive light-emitting devices in one column of the first pixel units are electrically connected with one of the first driving lines; and signals input into the first driving lines of each of the first sub-display regions at the same moment are the same, and signals input into the second driving lines of each of the first sub-display regions at the same moment are the same.

Optionally, in the embodiment of the present disclosure, the display panel further includes: a plurality of cathode isolating portions arranged in the first display region, where the cathode isolating portions are arranged between the cathodes of the at least two adjacent columns of passive light-emitting devices, to separate the cathodes of the at least two adjacent columns of passive light-emitting devices.

Optionally, in the embodiment of the present disclosure, each of the cathode isolating portions has at least one isolating strip layer;

a section of each isolating strip layer in an extending direction perpendicular to the cathode isolating portion has a first side close to the base substrate and a second side far away from the base substrate; and a distance of the second side is larger than that of the first side.

Optionally, in the embodiment of the present disclosure, each of the cathode isolating portions includes a plurality of isolating strip layers arranged at intervals; each of the cathode isolating portions further includes: a plurality of cathode inhibitor layers arranged at intervals; and in the same cathode isolating portion, orthographic projections of the cathode inhibitor layers on the base substrate and orthographic projections of the isolating strip layers on the base substrate are arranged alternately.

Optionally, in the embodiment of the present disclosure, the section of each of the isolating strip layers in an extending direction perpendicular to the cathode isolating portion is in a "T" shape or an inverted trapezoidal shape.

Optionally, in the embodiment of the present disclosure, the light-emitting device layer includes:

a first electrode layer, located on the side, facing away from the base substrate, of the pixel circuit layer; where the first electrode layer includes anodes of the active light-emitting devices and anodes of the passive light-emitting devices;

a pixel defining layer, located on one side, facing away from the base substrate, of the first electrode layer; where the pixel defining layer has a plurality of openings, and an orthographic projection of one of the openings on the base substrate is located in an orthographic projection of one of the anodes on the base substrate;

a light-emitting function layer, located on one side, facing away from the base substrate, of the pixel defining layer; where an orthographic projection of the light-emitting function layer on the base substrate covers orthographic projections of the openings on the base substrate; and a second electrode layer, located on one side, facing away from the base substrate, of the light-emitting function layer; where the second electrode layer includes cathodes of the active light-emitting devices and cathodes of the passive light-emitting devices;

where the isolating strip layers are located between the pixel defining layer and the light-emitting function layer, and an orthographic projection of the pixel defining layer on the base substrate covers orthographic projections of the isolating strip layers on the base substrate; and the cathode inhibitor layers are located between the light-emitting function layer and the second electrode layer, and the orthographic projection of the pixel defining layer on the base substrate covers orthographic projections of the cathode inhibitor layers on the base substrate.

Optionally, in the embodiment of the present disclosure, in the same first pixel unit, the first color sub-pixel and the third color sub-pixel are arranged in the same row, and the second color sub-pixel is located in a row adjacent to the row where the first color sub-pixel and the third color sub-pixel are located;

in the first display region, the rows where the first color sub-pixels are located and the rows where the second color sub-pixels are located are arranged alternately in a column direction;

in the same row of the first display region, the cathode inhibitor layer is arranged between every two adjacent second color sub-pixels; and in the same row of the first display region, the isolating strip layer is arranged between the first color sub-pixel and the third color sub-pixel which are adjacent and located in different first pixel units.

Optionally, in the embodiment of the present disclosure, the cathode isolating portions which are arranged around an edge of the first display region are arranged on one side, facing the second display region, of the first display region; and/or in a row direction, the cathode inhibitor layers are arranged between the second color sub-pixels in the edge of the first display region and the second display region, the isolating strip layers are arranged between the third color sub-pixels in the edge of the first display region and the second display region, the isolating strip layers are arranged between the first color sub-pixels in the edge of the first display region and the second display region; and in the column direction, the isolating strip layers are arranged between the second color sub-pixels in the edge of the first display region and the second display region.

Optionally, in the embodiment of the present disclosure, the second display region includes a plurality of second pixel units, each of the second pixel units includes a fourth color sub-pixel, two fifth color sub-pixels and a sixth color sub-pixel, where one active light-emitting device and one pixel circuit are arranged in each of the fourth color sub-pixel, the fifth color sub-pixels and the sixth color sub-pixel in the second display region respectively;

a distance of a cathode inhibitor layer in the row direction is larger than or approximately equal to a distance between a center of a light-emitting region of the fourth color sub-pixel and a center of a light-emitting region of the sixth color sub-pixel in the same second pixel unit;

a distance of the cathode inhibitor layer in the column direction is larger than or approximately equal to a minimum distance between light-emitting regions of the two adjacent fourth color sub-pixels in the second display region in the column direction, and the distance of the cathode inhibitor layer in the column direction is smaller than a distance between centers of the light-emitting regions of the two adjacent fourth color sub-pixels in the second display region in the column direction; and/or a light-emitting area of one of the first color sub-pixels in the first display region is larger than or approximately equal to a light-emitting area of one of the fourth color sub-pixels in the second display region;

a light-emitting area of one of the second color sub-pixels in the first display region is larger than or approximately equal to a light-emitting area of at least one of the two fifth color sub-pixels in the second display region; and a light-emitting area of one of the third color sub-pixels in the first display region is larger than or approximately equal to a light-emitting area of one of the sixth color sub-pixels in the second display region.

Optionally, in the embodiment of the present disclosure, a pixel distribution density in the first display region is smaller than a pixel distribution density in the second display region.

An embodiment of the present disclosure further provides a display apparatus, including the above display panel.

An embodiment of the present disclosure further provides a driving method of the display panel, including:

in a first display mode, driving passive light-emitting devices in a first display region to emit light to make the first display region display an image, and controlling pixel circuits in a second display region to work to make the pixel circuits drive active light-emitting devices electrically connected therewith to emit light and then make the second display region display an image;

in a second display mode, driving the passive light-emitting devices in the first display region to emit light to make the first display region display the image and make the second display region not emit light; and in a third display mode, controlling the pixel circuits in the second display region to work to make the pixel circuits drive the active light-emitting devices electrically connected therewith to emit light and then make the second display region display the image and make the first display region not emit light.

Optionally, in the embodiment of the present disclosure, the driving the passive light-emitting devices in the first display region to emit light to make the first display region display the image, includes:

driving the passive light-emitting devices in each first sub-display region column by column simultaneously to make the passive light-emitting devices in each first sub-display region emit light column by column.

DETAILED DESCRIPTION OF THE EMBODIMENTS

Figure 1:
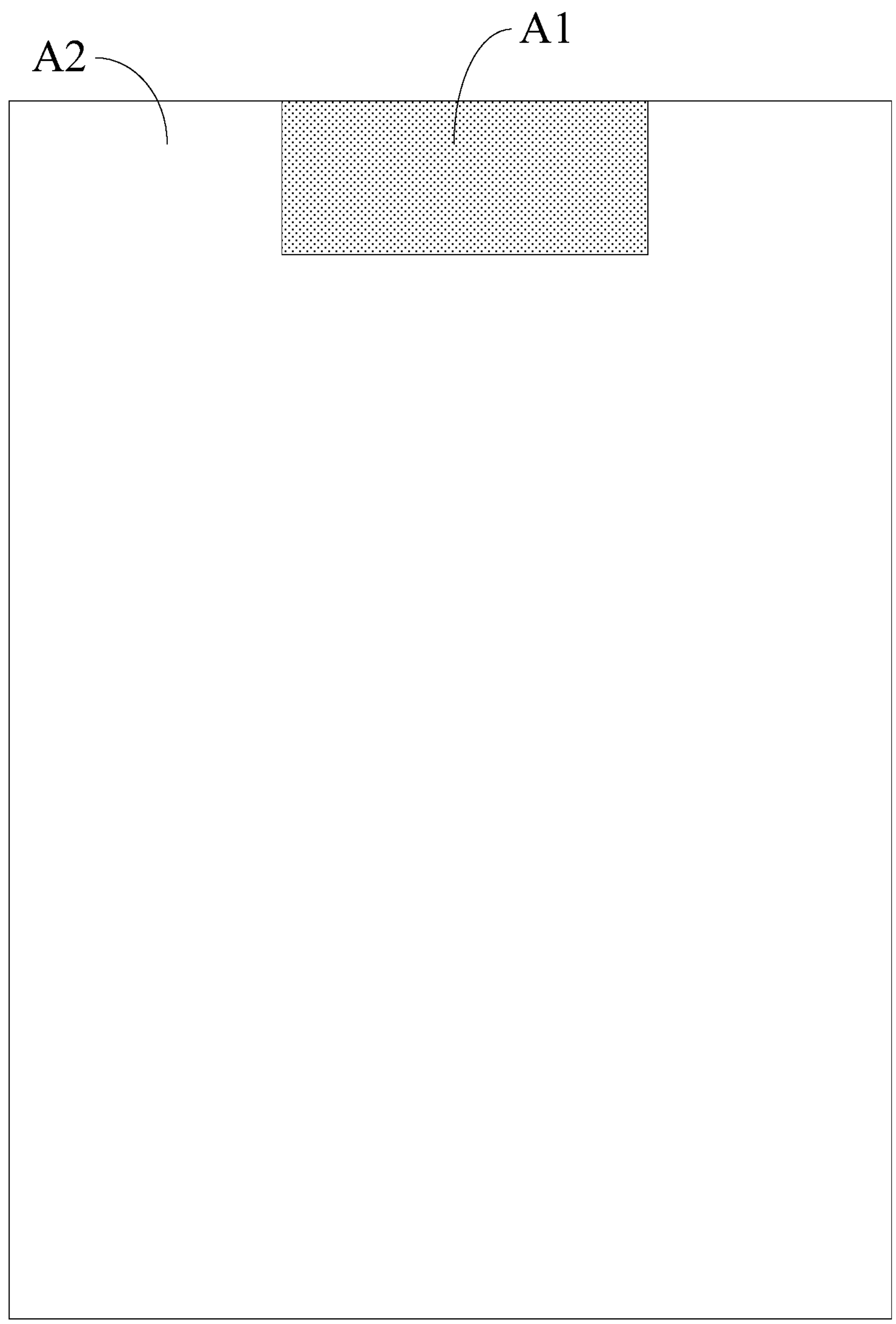
FIG. 1 is a schematic diagram of a basic structure of a display panel provided by an embodiment of the present disclosure.

In order to make objectives, technical solutions and advantages of embodiments of the present disclosure clearer, the technical solutions of the embodiments of the present disclosure will be described clearly and completely below with reference to accompanying drawings of the embodiments of the present disclosure. Apparently, the described embodiments are some, but not all, of the embodiments of the present disclosure. The embodiments and features in the embodiments of the present disclosure can be mutually combined without a conflict. All of the other embodiments obtained by those of ordinary skill in the art without creative work on the basis of the described embodiments of the present disclosure fall within the protection scope of the present disclosure.

Unless otherwise defined, technical or scientific terms used by the present disclosure should be commonly understood by those of ordinary skill in the art of the present disclosure. "First", "second" and other similar words used in the present disclosure do not represent any sequence, quantity or significance and are only used for distinguishing different components. "Include" or "contain" and other similar words mean that a component or an item preceding the word covers components or items and their equivalents listed after the word without excluding other components or items. "Connection" or "connected" and other similar words may include an electrical connection, direct or indirect, instead of being limited to a physical or mechanical connection.

It should be noted that sizes and shapes of all figures in the drawings do not reflect a true scale and are only intended to illustrate contents of the present disclosure. The same or similar reference numbers denote the same or similar components or components with the same or similar functions all the time.

An embodiment of the present disclosure provides some display panels having a second display region A2 and a first display region A1, as shown in FIG. 1 to FIG. 7B, each of which includes:

a base substrate 100;

a pixel circuit layer on the base substrate 100, where the pixel circuit layer is located in the second display region A2 and includes a plurality of pixel circuits; and a light-emitting device layer, located on one side, facing away from the base substrate 100, of the pixel circuit layer; where the light-emitting device layer includes a plurality of active light-emitting devices 120 and a plurality of passive light-emitting devices 130. The plurality of active light-emitting devices 120 are arranged in the second display region A2, each of the pixel circuits is electrically connected with at least one of the active light-emitting devices 120, and the plurality of passive light-emitting devices 130 are arranged in the first display region A1 in an array mode, where the first display region A1 includes: a plurality of first sub-display regions (for example, A11, A12, A13 and A14), and the plurality of first sub-display regions (for example, A11, A12, A13 and A14) are configured to be driven separately so as to make the first display region A1 display an image.

According to the display panel provided by the embodiments of the present disclosure, the active light-emitting devices may be controlled by using independent pixel circuits so as to enable each of the active light-emitting devices to emit light continuously and independently. Therefore, by arranging the pixel circuit layer with the pixel circuits and the active light-emitting devices in the second display region and electrically connecting the pixel circuits with the active light-emitting devices, the pixel circuits can be adopted to drive the active light-emitting devices to emit light in the second display region, so that the second display region can realize a display function. Besides, the passive light-emitting devices but not the pixel circuits are arranged in the first display region, so that the first display region can realize the display function by using the passive light-emitting devices to emit light, and further a light transmittance can be higher by making the first display region free of the pixel circuits and a metal routing wire. In this way, when the display panel is applied to a display apparatus, a front camera, a sensor, a receiver and other elements may be arranged below the first display region of the display panel so that the design of a full screen can be realized and a screen-to-body ratio can be increased.

During actual application, a plurality of sensors are arranged below the first display region A1 in general, so that a distance of the first display region A1 in a row direction F2 is wider. In the embodiments of the present disclosure, the first display region A1 is partitioned and sub-pixels in the first display region A1 are driven in a partitioned mode, so that a light-emitting duty ratio of the passive light-emitting devices 130 in each column of first pixel units PX1 can be increased and then brightness of the first display region A1 can be improved.

Figure 2:
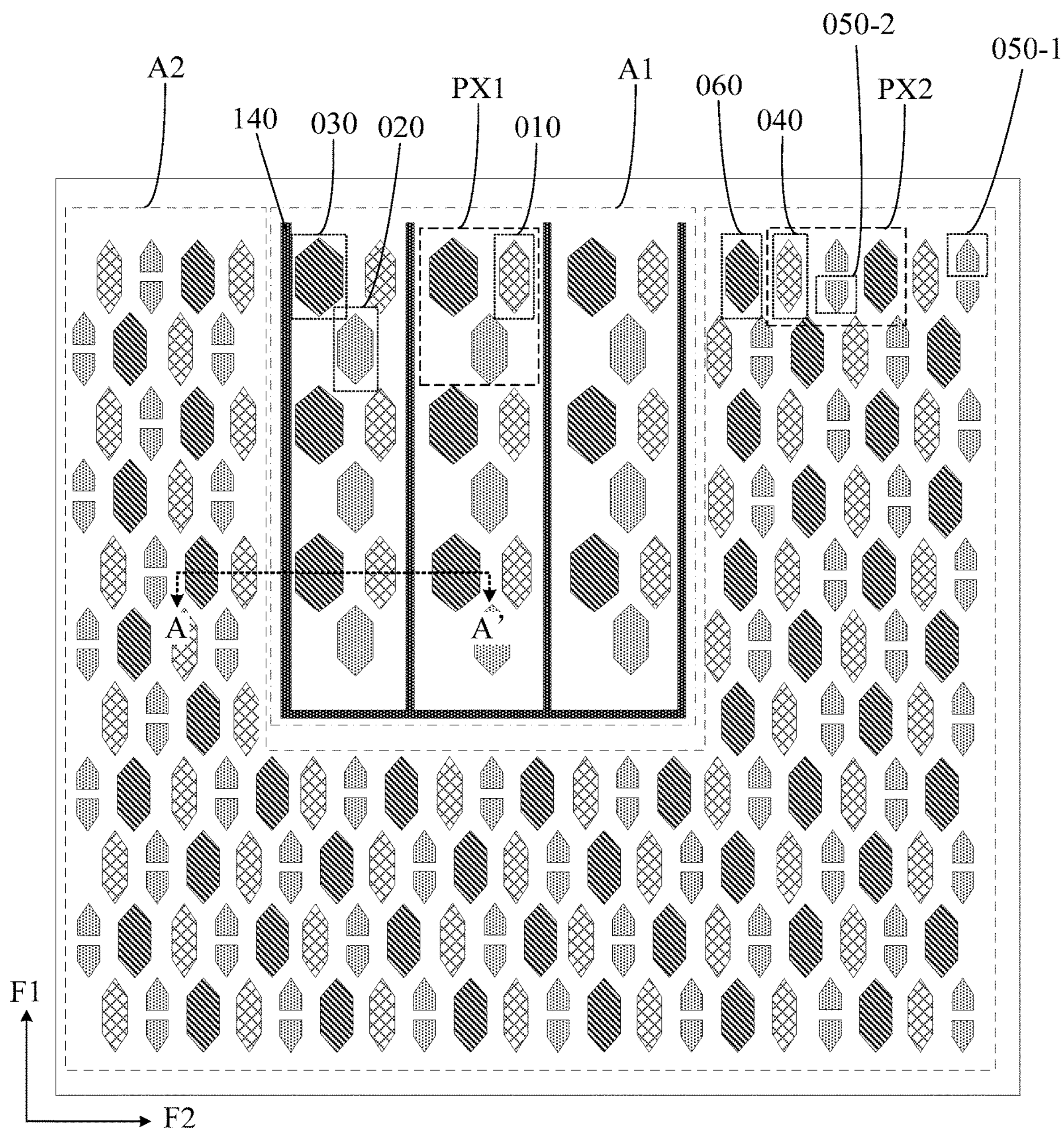
FIG. 2 is a schematic diagram of a detailed structure of some display panels provided by an embodiment of the present disclosure.
Figure 4:
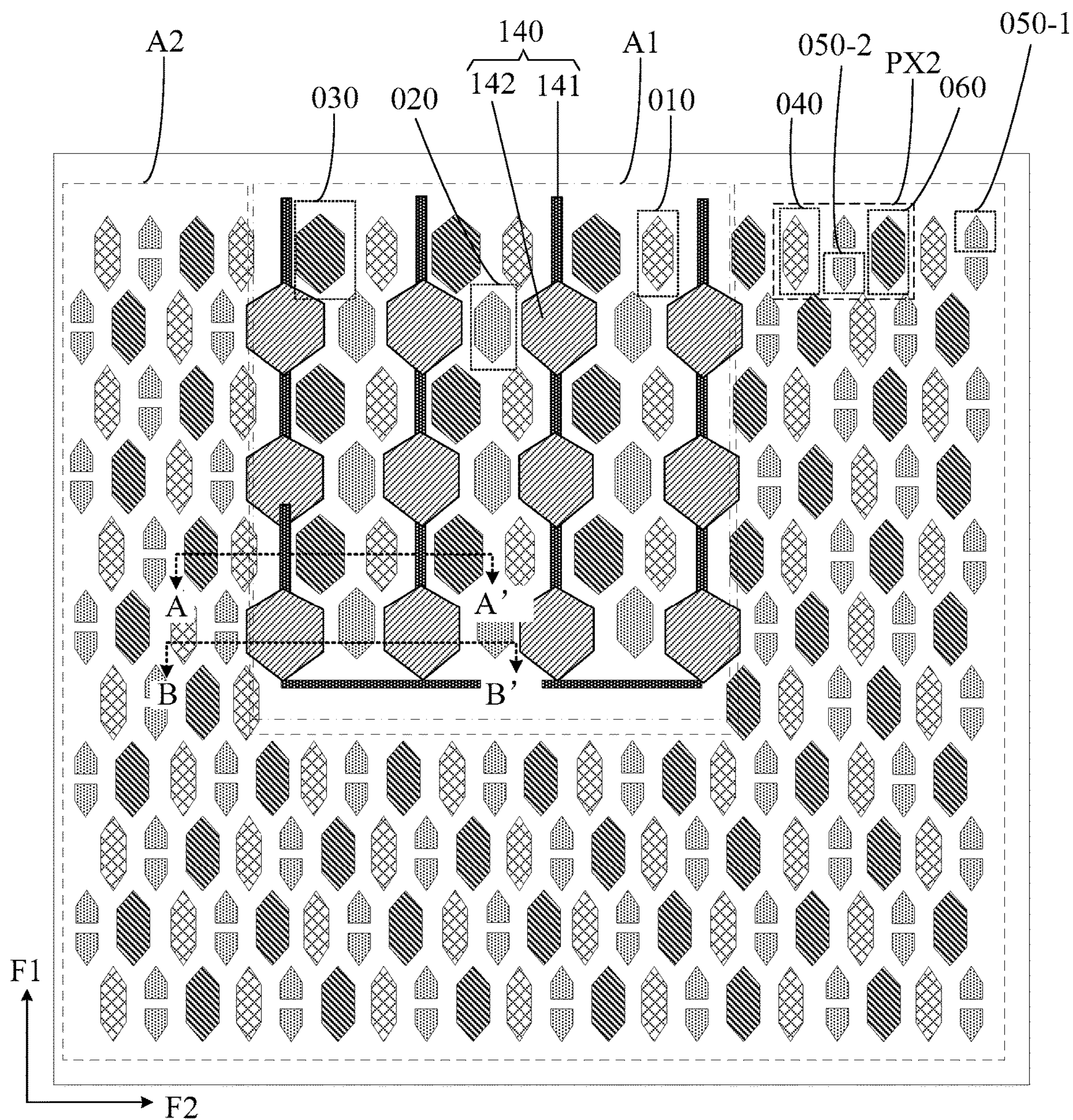
FIG. 4 is a schematic diagram of a detailed structure of some other display panels provided by an embodiment of the present disclosure.

During specific implementation, in the embodiments of the present disclosure, as shown in FIG. 2 and FIG. 4, the first display region A1 includes a plurality of first pixel units PX1 arranged in an array mode. Each first pixel unit PX1 includes a first color sub-pixel 010, a second color sub-pixel 020 and a third color sub-pixel 030. Besides, one of the passive light-emitting devices 130 is arranged in each first color sub-pixel 010, each second color sub-pixel 020 and each third color sub-pixel 030 in the first display region A1 respectively. Accordingly, a display effect can be realized in the first display region A1 through the first pixel units PX1.

During specific implementation, in the embodiments of the present disclosure, the number of columns of the first pixel units PX1 included in each of the first sub-display regions may be the same so that uniformity of driving each of the first sub-display regions can be improved. Certainly, the number of columns of the first pixel units PX1 included in each of the first sub-display regions may be different, which can be designed and determined according to actual application demands and will not be limited herein.

Exemplarily, the passive light-emitting device 130 in the first color sub-pixel 010 is configured to emit light with a first color, the passive light-emitting device 130 in the second color sub-pixel 020 is configured to emit light with a second color, and the passive light-emitting device 130 in the third color sub-pixel 030 is configured to emit light with a third color. In some examples, the first color, the second color and the third color may be selected from red, green and blue. For example, the first color is red, the second color is green and the third color is blue. Certainly, the embodiment of the present disclosure includes but is not limited to this. The first color, the second color and the third color may also be other colors.

Figure 7A:
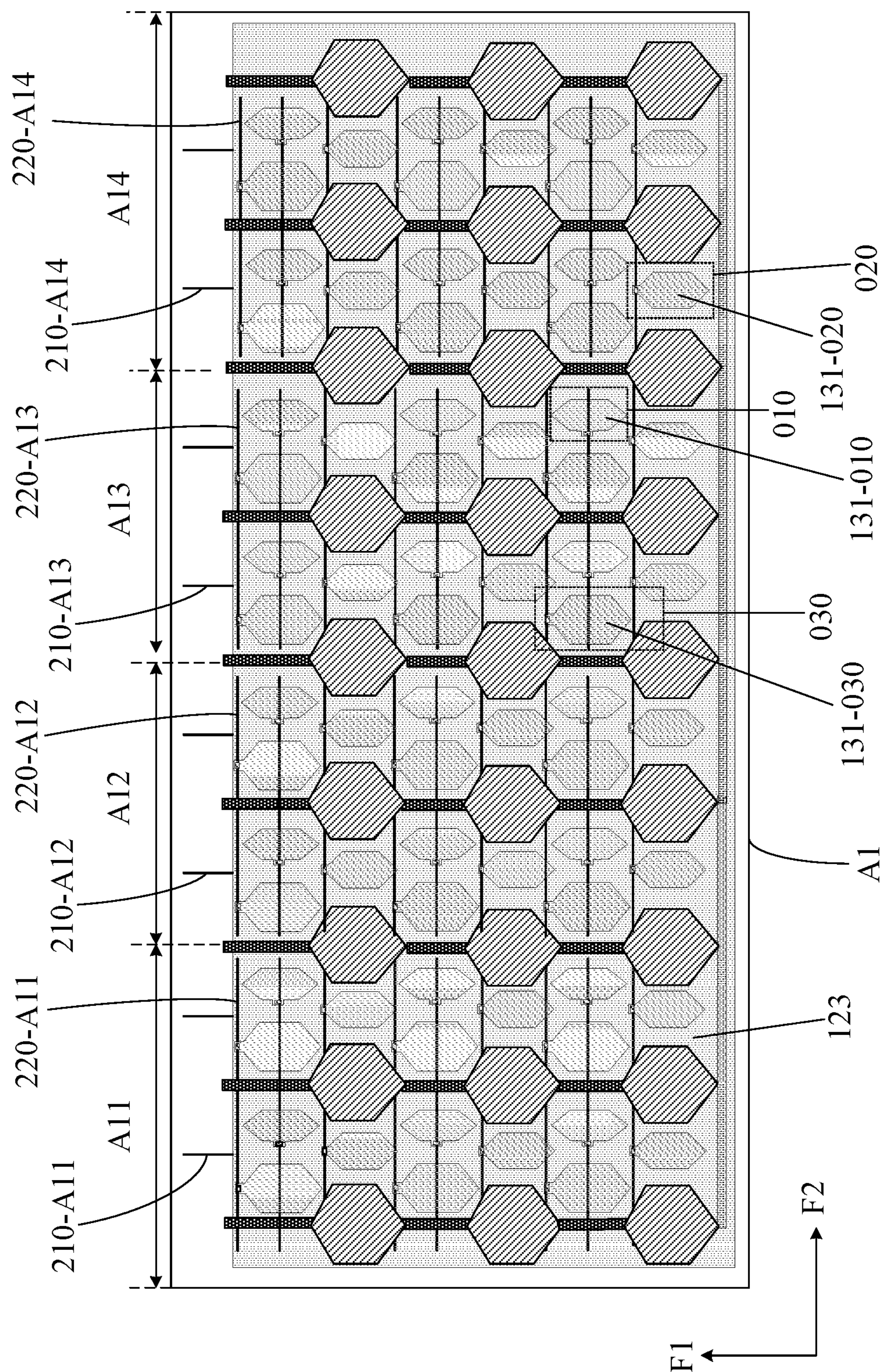
FIG. 7A is a schematic diagram of a detailed structure of some other display panels provided by an embodiment of the present disclosure.
Figure 7B:
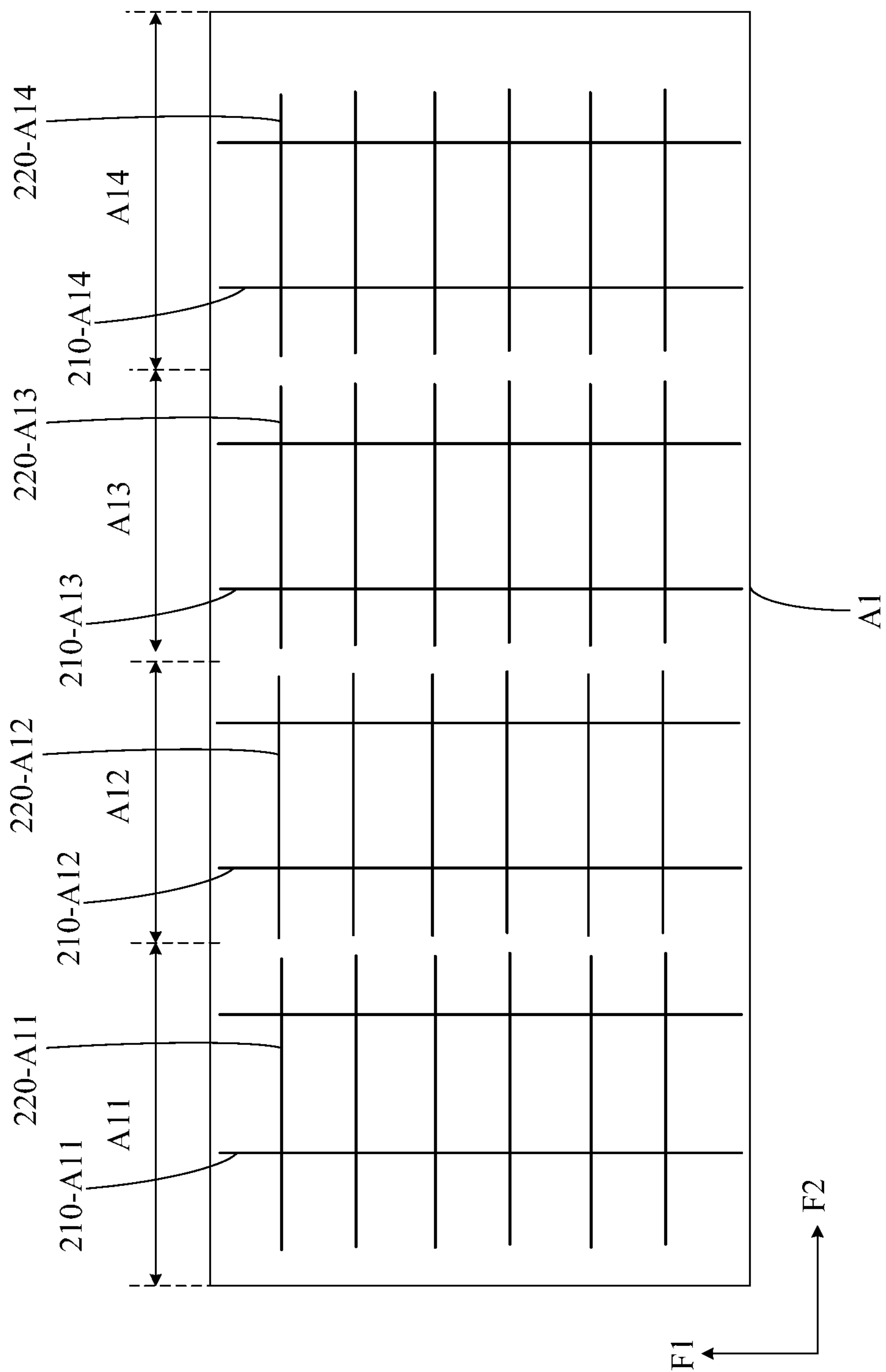
FIG. 7B is a schematic structural diagram of equivalent signal lines of the display panels shown in FIG. 7A.

During specific implementation, in the embodiments of the present disclosure, as shown in FIG. 7A and FIG. 7B, the first display region A1 includes: the four first sub-display regions A11, A12, A13, and A14 arranged in the row direction F2. In this way, the light-emitting duty ratio of the passive light-emitting devices 130 in each column of first pixel units PX1 may be increased by four times so that the brightness of the first display region A1 can be improved. Certainly, during actual application, the first display region A1 may also include two or three or five or more first sub-display regions, which can be designed and determined according to actual application demands and will not be limited herein.

During specific implementation, in the embodiments of the present disclosure, as shown in FIG. 7A and FIG. 7B, each of the first sub-display regions further includes: a plurality of first driving lines and a plurality of second driving lines. Cathodes of the passive light-emitting devices in one column are electrically connected with one of the first driving lines; anodes of the passive light-emitting devices in one row are electrically connected with one of the second driving lines; and the second driving lines in the different first sub-display regions are arranged at intervals. Optionally, anodes of the passive light-emitting devices in the same color sub-pixel in one row are electrically connected with one of the second driving lines, and cathodes of the passive light-emitting devices in one column of the first pixel units are electrically connected with one of the first driving lines. Besides, signals input into the first driving lines of each of the first sub-display regions at the same moment are the same, and signals input into the second driving lines of each of the first sub-display regions at the same moment are the same.

Exemplarily, as shown in FIG. 7A and FIG. 7B, the first sub-display region A11 includes the plurality of first driving lines 210-A11 and the plurality of second driving lines 220-A11. The cathodes of the passive light-emitting devices in one column of the first pixel units are electrically connected with one first driving line 210-A11, and the anodes of the passive light-emitting devices in the same color sub-pixel in one row are electrically connected with one second driving line 220-A11. For example, in one column of the first pixel units, the cathodes of the passive light-emitting devices in the first color sub-pixels 010, the cathodes of the passive light-emitting devices in the second color sub-pixels 020 and the cathodes of the passive light-emitting devices in the third color sub-pixels are an integrated structure and are electrically connected with one first driving line 210-A11. In one row of the first pixel units, the anodes 131-010 of the passive light-emitting devices in the first color sub-pixels 010 are electrically connected with one of the second driving lines 220-A11. The anodes 131-030 of the passive light-emitting devices in the third color sub-pixels 030 are electrically connected with another second driving line 220-A11. The anodes 131-020 of the passive light-emitting devices in the second color sub-pixels 020 are electrically connected with yet another second driving line 220-A11. In this way, corresponding signals can be input into the cathodes of the passive light-emitting devices in the first sub-display A11 through the first driving lines 210-A11, and corresponding signals can be input into the anodes of the passive light-emitting devices in the first sub-display region A11 through the second driving lines 220-A11, so that the passive light-emitting devices in the first sub-display region A11 can be driven to emit light and then make the first sub-display region A11 display an image.

Exemplarily, as shown in FIG. 7A and FIG. 7B, the first sub-display region A12 includes: the plurality of first driving lines 210-A12 and the plurality of second driving lines 220-A12. The cathodes of the passive light-emitting devices in one column are electrically connected with one first driving line 210-A12, and the anodes of the passive light-emitting devices in the same color sub-pixel in one row are electrically connected with one second driving line 220-A12. For example, in one column of the first pixel units, the cathodes of the passive light-emitting devices in the first color sub-pixels 010, the cathodes of the passive light-emitting devices in the second color sub-pixels 020 and the cathodes of the passive light-emitting devices in the third color sub-pixels are an integrated structure and are electrically connected with one first driving line 210-A12. In one row of the first pixel units, the anodes of the passive light-emitting devices in the first color sub-pixels 010 are electrically connected with one of the second driving lines 220-A12. The anodes 131-030 of the passive light-emitting devices in the third color sub-pixels 030 are electrically connected with another second driving line 220-A12. The anodes 131-020 of the passive light-emitting devices in the second color sub-pixels 020 are electrically connected with yet another second driving line 220-A12. In this way, the corresponding signals can be input into the cathodes of the passive light-emitting devices in the first sub-display region A12 through the first driving lines 210-A12, and the corresponding signals can be input into the anodes of the passive light-emitting devices in the first sub-display region A12 through the second driving lines 220-A12, so that the passive light-emitting devices in the first sub-display region A12 can be driven to emit light and then make the first sub-display region A12 display the image.

Exemplarily, as shown in FIG. 7A and FIG. 7B, the first sub-display region A13 includes: the plurality of first driving lines 210-A13 and the plurality of second driving lines 220-A13. The cathodes of the passive light-emitting devices in one column are electrically connected with one first driving line 210-A13, and the anodes of the passive light-emitting devices in the same color sub-pixel in one row are electrically connected with one second driving line 220-A13. For example, in one column of the first pixel units, the cathodes of the passive light-emitting devices in the first color sub-pixel 010, the cathodes of the passive light-emitting devices in the second color sub-pixels 020 and the cathodes of the passive light-emitting devices in the third color sub-pixels are an integrated structure and are electrically connected with one of the first driving lines 210-A13. In one row of first pixel units, the anodes 131-010 of the passive light-emitting devices in the first color sub-pixels 010 are electrically connected with one of the second driving lines 220-A13. The anodes 131-030 of the passive light-emitting devices in the third color sub-pixels 030 are electrically connected with another second driving line 220-A13. The anodes 131-020 of the passive light-emitting devices in the second color sub-pixels 020 are electrically connected with yet another second driving line 220-A13. In this way, the corresponding signals can be input into the cathodes of the passive light-emitting devices in the first sub-display region A13 through the first driving lines 210-A13, and the corresponding signals can be input into the anodes of the passive light-emitting devices in the first sub-display region A13 through the second driving lines 220-A13, so that the passive light-emitting devices in the first sub-display region A13 can be driven to emit light and then make the first sub-display region A13 display the image.

Exemplarily, as shown in FIG. 7A and FIG. 7B, the first sub-display region A14 includes: the plurality of first driving lines 210-A14 and the plurality of second driving lines 220-A14. The cathodes of the passive light-emitting devices in one column are electrically connected with one first driving line 210-A14, and the anodes of the passive light-emitting devices in the same color sub-pixel in one row are electrically connected with one second driving line 220-A14. For example, in one column of the first pixel units, the cathodes of the passive light-emitting devices in the first color sub-pixels 010, the cathodes of the passive light-emitting devices in the second color sub-pixels 020 and the cathodes of the passive light-emitting devices in the third color sub-pixels are an integrated structure and are electrically connected with one of the first driving lines 210-A14. In one row of the first pixel units, the anodes 131-010 of the passive light-emitting devices in the first color sub-pixels 010 are electrically connected with one of the second driving lines 220-A14. The anodes 131-030 of the passive light-emitting devices in the third color sub-pixels 030 are electrically connected with another second driving line 220-A14. The anodes 131-020 of the passive light-emitting devices in the second color sub-pixels 020 are electrically connected with yet another second driving line 220-A14. In this way, the corresponding signals can be input into the cathodes of the passive light-emitting devices in the first sub-display region A14 through the first driving lines 210-A14, and the corresponding signals can be input into the anodes of the passive light-emitting devices in the first sub-display region A14 through the second driving lines 220-A14, so that the passive light-emitting devices in the first sub-display region A14 can be driven to emit light and then make the first sub-display region A14 display the image.

During specific implementation, in the embodiments of the present disclosure, as shown in FIG. 1 to FIG. 7B, the anodes of the passive light-emitting devices in the same color sub-pixel in one row are electrically connected with one of the second driving lines, and the cathodes of the passive light-emitting devices in the first pixel units in one column are electrically connected with one of the first driving lines.

During specific implementation, in the embodiments of the present disclosure, as shown in FIG. 1 to FIG. 7B, the display panel further includes a plurality of cathode isolating portions 140, arranged in the first display region A1. The cathode isolating portions 140 are arranged between the cathodes of at least two adjacent columns of the passive light-emitting devices 130, so as to separate the cathodes of the two adjacent columns of passive light-emitting devices 130. In general, when the cathodes are prepared, the cathodes are evaporated on a whole surface of the base substrate 100 by using an evaporation process. In this way, it is disadvantageous for forming a passive matrix organic light-emitting diode (PMOLED) in the first display region A1. In the embodiments of the present disclosure, the cathode isolating portions 140 are arranged between the cathodes of the at least two adjacent columns of the passive light-emitting devices 130, so that during preparation, after the cathode isolating portions 140 are covered with the cathodes, the cathodes can be automatically separated at the cathode isolating portions 140, and thus the cathodes of the two adjacent columns of the passive light-emitting devices 130 are separated.

In some examples, materials of the cathodes of the active light-emitting devices 120 and the passive light-emitting devices 130 are the same and can be formed by using a single evaporation process. Exemplarily, the material of the cathodes of the active light-emitting devices 120 and the passive light-emitting devices 130 may be a metal material, for example, Mg, modified Mg, Al, Au, Ag, etc., which is not limited herein.

It needs to be noted that if a mask is adopted, though the cathodes can be evaporated on the first display region A1, the metal material of the cathodes may be formed on the mask while the cathodes are evaporated, which leads to failure in reusing of the mask and waste of the mask. In the embodiments of the present disclosure, the cathode isolating portions 140 are arranged between the cathodes of the at least two adjacent columns of the passive light-emitting devices 130, and the cathode isolating portions 140 are covered with the cathodes so that the cathodes can be automatically separated at the cathode isolating portions 140, and thus waste of the mask can be avoided and the preparation cost is reduced.

During specific implementation, in the embodiments of the present disclosure, as shown in FIG. 2 and FIG. 4, the cathode isolating portions 140 may be arranged between the cathodes of every two adjacent columns of the passive light-emitting devices 130, so that the cathodes of the every two adjacent columns of the passive light-emitting devices 130 can be separated. Besides, in the first display region A1, the anodes of the passive light-emitting devices 130 in the same row are electrically connected.

During specific implementation, in the embodiments of the present disclosure, each of the pixel circuits may include a storage capacitor and a transistor electrically connected with the storage capacitor. For example, the pixel circuits may include at least one of a 2T1C pixel circuit, a 3T1C pixel circuit or a 7T1C pixel circuit. Description is made below by taking a transistor TF in each of the pixel circuits for example. As shown in FIG. 3A, FIG. 3B, FIG. 5A and FIG. 5B, the pixel circuit layer may include: an active layer 111 located on the base substrate 100; a gate insulating layer 116 located on one side, facing away from the base substrate 100, of the active layer; a gate 112 located on one side, facing away from the base substrate 100, of the gate insulating layer 116; an interlayer dielectric layer 117 located on one side, facing away from the base substrate 100, of the gate 112; a capacitance electrode layer 113 located on one side, facing away from the base substrate 100, of the interlayer dielectric layer 117; an interlayer insulation layer 118 located on one side, facing away from the base substrate 100, of the capacitance electrode layer 113; a source 114 and a drain 115 located on one side, facing away from the base substrate 100, of the interlayer insulation layer 118; and a planarization layer 119 located on one side, facing away from the base substrate 100, of a layer where the source 114 and the drain 115 are located. The source 114 and the drain 115 are electrically connected with the active layer through via holes respectively penetrating through the gate insulating layer 116, the interlayer dielectric layer 117 and the interlayer insulation layer 118, thereby forming the transistor TF. The gate 112 and the capacitance electrode layer 113 have a directly facing area so as to form the storage capacitor.

During specific implementation, in the embodiments of the present disclosure, the second driving lines and the gates 112 can be formed by using a single patterning process so that the second driving lines and the gates 112 can be arranged on the same layer at intervals. Or the second driving lines and the capacitance electrode layers 113 can be formed by using the single patterning process so that the second driving lines and the capacitance electrode layers 113 can be arranged on the same layer at intervals. Or the second driving lines, the sources 114 and the drains 115 can be formed by using the single patterning process so that the second driving lines, the sources 114 and the drains 115 can be arranged on the same layer at intervals. Certainly, during actual application, it can be designed and determined according to actual application demands and will not be limited herein.

During specific implementation, in the embodiments of the present disclosure, as shown in FIG. 3A, FIG. 3B, FIG. 5A and FIG. 5B, the light-emitting device layer may include: a first electrode layer located on one side, facing away from the base substrate 100, of the pixel circuit layer; a pixel defining layer 101 located on one side, facing away from the base substrate 100, of the first electrode layer; a light-emitting function layer located on one side, facing away from the base substrate 100, of the pixel defining layer 101; and a second electrode layer located on one side, facing away from the base substrate 100, of the light-emitting function layer. The first electrode layer includes the anodes 121 of the active light-emitting devices 120 and the anodes 131 of the passive light-emitting devices 130. The pixel defining layer has a plurality of openings, and an orthographic projection of one of the openings on the base substrate 100 is located in an orthographic projection of one of the anodes on the base substrate 100. An orthographic projection of the light-emitting function layer on the base substrate 100 covers orthographic projections of the openings on the base substrate. The light-emitting function layer includes light-emitting layers 122 of the active light-emitting devices 120 and light-emitting layers 132 of the passive light-emitting devices 130. The second electrode layer includes the cathodes 123 of the active light-emitting devices 120 and the cathodes 133 of the passive light-emitting devices 130. Exemplarily, the anodes of the active light-emitting devices 120 are electrically connected with the drains 115 of the transistors TF through via holes penetrating through the planarization layer 119, so that a driving current can be transmitted to the active light-emitting devices 120 through the drains 115 of the transistors TF to drive the active light-emitting devices 120 to emit light.

During actual application, the gate, the source, the drain and the storage capacitor of the transistor in each of the pixel circuits are usually made of a metal material, and signal lines (for example, a gate line and a data line) inputting signals into the transistor are also made of a metal material. As shown in FIG. 3A, FIG. 3B, FIG. 5A and FIG. 5B, the second display region A2 has the pixel circuits and the signal lines, and thus transmittance of the second display region A2 is low. Only these transparent insulation film layers such as the gate insulating layer 116, the interlayer dielectric layer 117, the interlayer insulation layer 118 and the planarization layer 119 and the passive light-emitting devices 130 are arranged in the first display region A1, and the gate, the source, the drain, and the storage capacitor in each of the transistors and the signal lines are not arranged in the first display region A1, so that transmittance in the first display region A1 can be improved as much as possible.

During specific implementation, in the embodiments of the present disclosure, each of the active light-emitting devices 120 may include an active-matrix organic light-emitting diode (AMOLED). Each of the passive light-emitting devices 130 may include a PMOLED. Certainly, during actual application, specific implementations of the active light-emitting devices 120 and the passive light-emitting devices 130 may also be designed and determined according to an actual application environment and will not be limited herein.

During specific implementation, in the embodiment of the present disclosure, as shown in FIG. 2 to FIG. 5B, each of the cathode isolating portions 140 may have at least one isolating strip layer 141. Besides, a section of each of the isolating strip layers 141 in an extending direction perpendicular to the cathode isolating portion 140 has a first side close to the base substrate 100 and a second side far away from the base substrate 100, and a distance W12 of the second side is larger than a distance W11 of the first side. As the distance W12 of the second side is larger than the distance W11 of the first side, the cathodes covering the isolating strip layers 141 can be more likely to slide off, and thus the cathodes of the two adjacent columns of the passive light-emitting devices 130 can be further automatically separated.

Figure 3A:
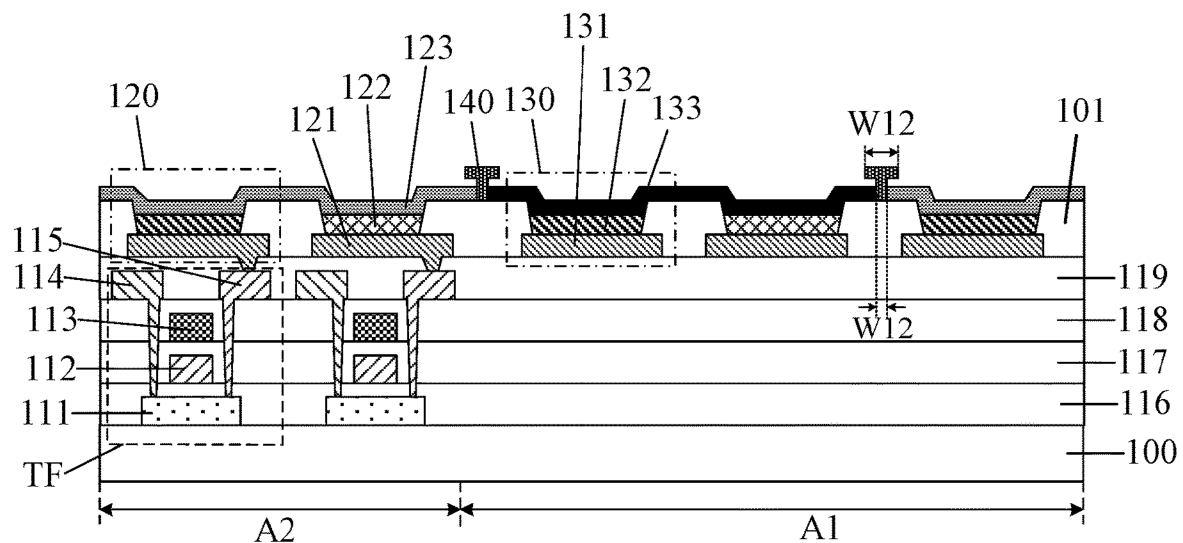
FIG. 3A is a schematic diagram of some sectional structures of the display panels in a direction AA' shown in FIG. 2.
Figure 3B:
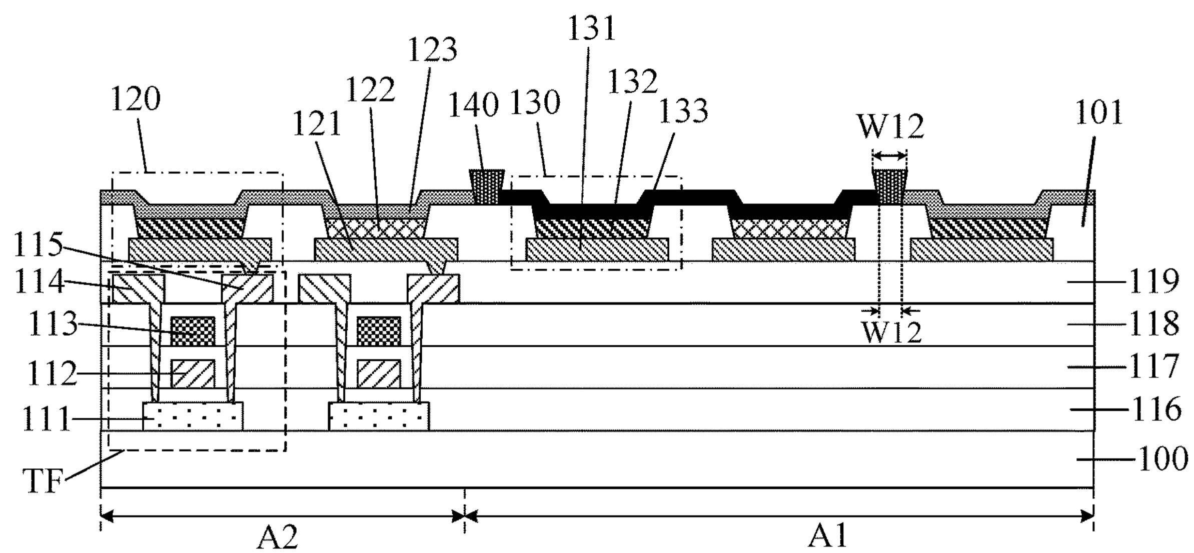
FIG. 3B is a schematic diagram of some other sectional structures of the display panels in the direction AA' shown in FIG. 2.

Exemplarily, as shown in FIG. 2 to FIG. 3B, each of the cathode isolating portions 140 may have one isolating strip layer 141. The isolating strip layer 141 serves as a barrier wall so as to separate the cathodes 133 of the two adjacent columns of the passive light-emitting devices 130. Besides, the isolating strip layers 141 are located between the pixel defining layer and the light-emitting function layer, so that an orthographic projection of the pixel defining layer on the base substrate 100 covers orthographic projections of the isolating strip layers 141 on the base substrate 100. During cathode evaporation, the cathodes covering the isolating strip layers 141 can be more likely to slide off so that the cathodes of the two adjacent columns of the passive light-emitting devices 130 can be further automatically separated.

Figure 5A:
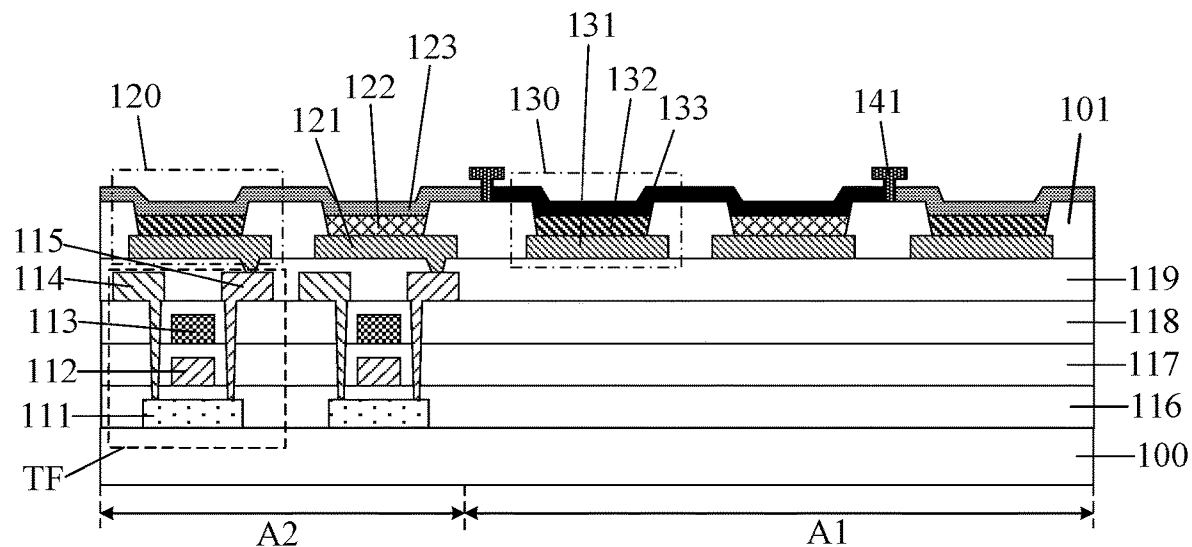
FIG. 5A is a schematic diagram of some sectional structures of the display panels in a direction AA' shown in FIG. 4.
Figure 5B:
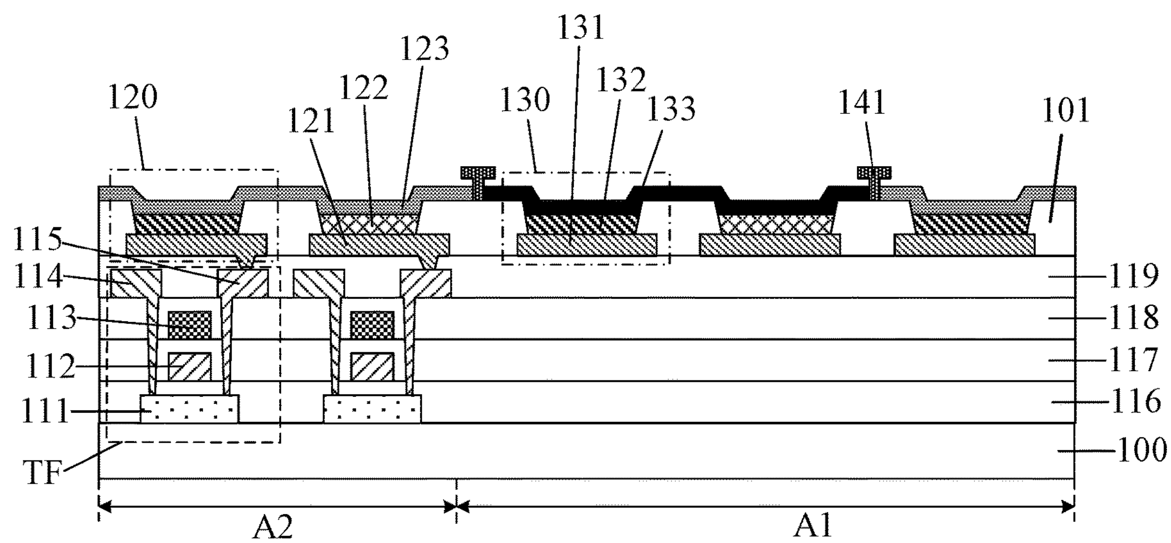
FIG. 5B is a schematic diagram of some sectional structures of the display panels in a direction BB' shown in FIG. 4.

Exemplarily, as shown in FIG. 4 to FIG. 5B, each of the cathode isolating portions 140 may include a plurality of isolating strip layers 141 arranged at intervals and may further include: a plurality of cathode inhibitor layers 142 arranged at intervals. In the same cathode isolating portion 140, orthographic projections of the cathode inhibitor layers 142 on the base substrate 100 and orthographic projections of the isolating strip layers 141 on the base substrate 100 are arranged alternately. In this way, the cathode inhibitor layers 142 and the isolating strip layers 141 can form the cathode isolating portion 140 between the cathodes 133 of the two columns of the passive light-emitting devices 130, so that the cathodes 133 of the two columns of the passive light-emitting devices 130 can be separated. Besides, the isolating strip layers 141 are located between the pixel defining layer and the light-emitting function layer, and the orthographic projection of the pixel defining layer on the base substrate 100 covers the orthographic projections of the isolating strip layers 141 on the base substrate 100. The cathode inhibitor layers 142 are located between the light-emitting function layer and the second electrode layer, and the orthographic projection of the pixel defining layer on the base substrate covers the orthographic projections of the cathode inhibitor layers 142 on the base substrate 100. During cathode evaporation, the cathodes covering the isolating strip layers 141 can be more likely to slide off, and thus the cathodes of the two adjacent columns of the passive light-emitting devices 130 can be further automatically separated.

In some examples, a material of each of the cathode inhibitor layers 142 is an organic material. When cathode evaporation is performed by using the evaporation process after the cathode inhibitor layers 142 are formed on the base substrate 100 through a fine metal mask (FMM), a cathode material is not deposited on the cathode inhibitor layers 142, and thus the cathodes of the two adjacent columns of the passive light-emitting devices 130 can be separated. Besides, light transmittance of a region where the cathode inhibitor layers 142 are located can also be improved, and light transmittance of the first display region A1 can be further improved. During actual application, the material of the cathode inhibitor layers 142 may adopt an organic material capable of realizing the above functions. A specific implementation of the material of the cathode inhibitor layers 142 may be designed and determined according to actual application demands and will not be limited herein. It needs to be noted that though the material of the cathode inhibitor layers 142 may be formed on the FMM, as the material of the cathode inhibitor layers 142 is the organic material, reusing of the FMM cannot be affected, and the FMM can be reused.

During specific implementation, in the embodiments of the present disclosure, the section of each of the isolating strip layers 141 in the extending direction perpendicular to the cathode isolating portion 140 is in a "T" shape or an inverted trapezoidal shape. Exemplarily, as shown in FIG. 3B, the section of each of the isolating strip layers 141 in the extending direction perpendicular to the cathode isolating portion 140 may be in an inverted trapezoidal shape. As shown in FIG. 3A and FIG. 5A, the section of each of the isolating strip layers 141 in the extending direction perpendicular to the cathode isolating portion 140 may be in a "T" shape. Certainly, during actual application, the section of each of the isolating strip layers 141 in the extending direction perpendicular to the cathode isolating portion 140 may also be arranged in other modes that the distance W12 of the second side is larger than the distance W11 of the first side, which is not limited herein.

During specific implementation, in the embodiments of the present disclosure, as shown in FIG. 2 and FIG. 4, the second display region A2 may include a plurality of second pixel units PX2. Each of the second pixel units includes a fourth color sub-pixel 040, two fifth color sub-pixels (such as 050-1 and 050-2) and a sixth color sub-pixel 060; where the two fifth color sub-pixels (such as 050-1 and 050-2) in the same second pixel unit PX2 are arranged in a column direction F1. Besides, one of the active light-emitting devices 120 and one of the pixel circuits are arranged in each of the fourth color sub-pixels 040, the fifth color sub-pixels (such as 050-1 and 050-2) and the sixth color sub-pixels 060 in the second display region A2 respectively. In this way, a display effect can be realized in the second display region A2 through the second pixel units PX2.

Exemplarily, the active light-emitting device 120 in the fourth color sub-pixel 040 is configured to emit light with a fourth color, the active light-emitting devices 120 in the fifth color sub-pixels (such as 050-1 and 050-2) are configured to emit light with a fifth color, and the active light-emitting device 120 in the sixth color sub-pixel 060 is configured to emit light with a sixth color. In some examples, the fourth color, the fifth color and the sixth color may be selected from red, green and blue. For example, the fourth color may be red, the fifth color may be green and the sixth color may be blue. Certainly, the embodiment of the present disclosure includes but is not limited to this. The fourth color, the fifth color and the sixth color may also be other colors.

During specific implementation, in the embodiments of the present disclosure, as shown in FIG. 2 and FIG. 4, the plurality of second pixel units PX2 are arranged in the row direction F2 to form pixel unit rows, the pixel unit rows are arranged in the column direction F1, and the second pixel units PX2 in every two adjacent pixel unit rows are arranged in a staggered mode. For example, the second pixel units PX2 in the (odd number)$^{th}$ rows and the second pixel units PX2 in the (even number) rows are arranged in a staggered mode, the second pixel units PX2 in the (odd number)$^{th}$ rows are aligned in the column direction F1, and the second pixel units PX2 in the (even number) rows are aligned in the column direction F1. Exemplarily, the second pixel units PX2 in every two adjacent pixel unit rows are staggered by ½ of a size of one second pixel unit PX2. It needs to be noted that the size of the second pixel unit PX2 may be: a distance between centers of the same color sub-pixels in every two adjacent second pixel units PX2 in the row direction F2. For example, the size of the second pixel unit PX2 may be: a distance between centers of the fourth color sub-pixels 040 in every two adjacent second pixel units PX2 in the row direction F2. Or, for example, the second pixel units PX2 in the adjacent pixel unit rows are mutually staggered in the column direction F1, that is, the adjacent second pixel units PX2 in the adjacent pixel unit rows have a certain offset in the row direction F2. Therefore, the same color sub-pixels in the adjacent pixel unit rows are not aligned in the column direction F1.

During specific implementation, in the embodiments of the present disclosure, as shown in FIG. 2 and FIG. 4, in each of the second pixel units PX2, a light-emitting area of the sixth color sub-pixel 060 is larger than a light-emitting area of the fourth color sub-pixel 040, and the light-emitting area of the fourth color sub-pixel 040 is larger than a light-emitting area of the fifth color sub-pixels (such as 050-1 and 050-2). Exemplarily, a light-emitting area of a blue sub-pixel is larger than a light-emitting area of a red sub-pixel, and the light-emitting area of the red sub-pixel is larger than a light-emitting area of a green sub-pixel. During actual application, it can be designed and determined according to actual application demands and will not be limited herein. It needs to be noted that in the display panel provided by the embodiment of the present disclosure, one sub-pixel is provided with one of the openings of the pixel defining layer, a region where each of the openings of the pixel defining layer is located is a light-emitting region of the sub-pixel, and a light-emitting area of the sub-pixel may refer to an area of the light-emitting region of the sub-pixel.

During specific implementation, in the embodiments of the present disclosure, as shown in FIG. 2 and FIG. 4, a pixel distribution density in the first display region A1 may be smaller than a pixel distribution density in the second display region A2. The pixel distribution density in the first display region A1 is smaller than the pixel distribution density in the second display region A2, so that the light transmittance of the first display region A1 can be further improved. It needs to be noted that the pixel distribution density refers to the number of pixels uniformly arranged in a unit area. Besides, when the first display region A1 does not display the image, the first display region A1 may be close to a transparent effect to the greatest degree, so that the front camera and the sensor below the display panel can obtain light from the first display region A1 for imaging. When the first display region A1 needs to display the image, as the first display region A1 still has the pixels, the first display region A1 can display the image.

During specific implementation, in the embodiments of the present disclosure, the pixel distribution density in the first display region A1 may be approximately equal to the pixel distribution density in the second display region A2. In this way, when the first display region A1 and the second display region A2 display the image normally together, a high resolution ratio can be achieved.

During specific implementation, in the embodiments of the present disclosure, as shown in FIG. 2 and FIG. 4, in each of the first pixel unit PX1, a light-emitting area of the third color sub-pixel 030 may be larger than a light-emitting area of the second color sub-pixel 020, and the light-emitting area of the second color sub-pixel 020 may be larger than a light-emitting area of the first color sub-pixel 010. Exemplarily, each of the first pixel units PX1 may be arranged according to an implementation that: a light-emitting area of a blue sub-pixel is larger than a light-emitting area of a green sub-pixel, and the light-emitting area of the green sub-pixel is larger than a light-emitting area of a red sub-pixel. During actual application, it can be designed and determined according to actual application demands and will not be limited herein.

During specific implementation, in the embodiments of the present disclosure, as shown in FIG. 2 and FIG. 4, in the same first pixel unit PX1, the first color sub-pixel 010 and the third color sub-pixel 030 are arranged in the same row, and the second color sub-pixel 020 is located in a row adjacent to the row where the first color sub-pixel 010 and the third color sub-pixel 030 are located. Exemplarily, in the same first pixel unit PX1, a light-emitting region of the first color sub-pixel 010 and a light-emitting region of the third color sub-pixel 030 are arranged in the same row, and a light-emitting region of the second color sub-pixel 020 is located in a row adjacent to the row where the light-emitting region of the first color sub-pixel 010 and the light-emitting region of the third color sub-pixel 030 are located. For example, in the same first pixel unit PX1, the light-emitting region of the first color sub-pixel 010 and the light-emitting region of the third color sub-pixel 030 are located in the first row, and the light-emitting region of the second color sub-pixel 020 is located in the second row. In this way, centers of the light-emitting region of the first color sub-pixel 010, the light-emitting region of the second color sub-pixel 020 and the light-emitting region of the third color sub-pixel 030 in the same first pixel unit PX1 may be connected to form a triangle. Accordingly, transverse dark stripes can be prevented from occurring in the first display region A1.

During specific implementation, in the embodiments of the present disclosure, as shown in FIG. 2 and FIG. 4, in the first display region A1, rows where the first color sub-pixels 010 are located and rows where the second color sub-pixels 020 are located are arranged alternately in the column direction F1. The anodes of the passive light-emitting devices 130 in each row of sub-pixels are electrically connected. Exemplarily, the first row has the first color sub-pixels 010 and the third color sub-pixels 030, and the anodes of the passive light-emitting devices 130 of the first color sub-pixels 010 and the third color sub-pixels 030 on the first row are electrically connected with one another. The second row has the second color sub-pixels 020, and the anodes of the passive light-emitting devices 130 in the second color sub-pixels 020 in the second row are electrically connected with one another. The third row has the first color sub-pixels 010 and the third color sub-pixels 030, and the anodes of the passive light-emitting devices 130 of the first color sub-pixels 010 and the third color sub-pixels 030 in the third row are electrically connected with one another. The fourth row has the second color sub-pixels 020, and the anodes of the passive light-emitting devices 130 of the second color sub-pixels 020 in the fourth row are electrically connected with one another.

During specific implementation, in the embodiments of the present disclosure, as shown in FIG. 2 and FIG. 4, in the first display region A1, the first pixel units PX1 are arranged in an array mode. Exemplarily, the cathodes 133 of the passive light-emitting devices 130 in the same column of the first pixel units PX1 are electrically connected, the cathode isolating portions 140 are arranged between the cathodes 133 of the passive light-emitting devices 130 in the at least two adjacent columns of the first pixel units PX1, and thus the cathodes 133 of the passive light-emitting devices 130 in the two adjacent columns of the first pixel units PX1 can be separated. For example, the cathodes 133 of the passive light-emitting devices 130 in each column of the first pixel units PX1 are electrically connected, and the cathode isolating portions 140 are arranged between the cathodes 133 of the passive light-emitting devices 130 in every two adjacent columns of the first pixel units PX1, so that the cathodes 133 of the passive light-emitting devices 130 in the every two adjacent columns of the first pixel units PX1 can be separated.

During specific implementation, in the embodiments of the present disclosure, as shown in FIG. 2 and FIG. 4, in the same row of the first display region A1, the cathode inhibitor layer 142 is arranged between every two adjacent second color sub-pixels 020. In this way, the cathodes 133 of the every two adjacent second color sub-pixels 020 in the same row can be separated through the cathode inhibitor layer 142.

During specific implementation, in the embodiments of the present disclosure, as shown in FIG. 2 and FIG. 4, in the same row of the first display region A1, the isolating strip layer 141 is arranged between the first color sub-pixel 010 and the third color sub-pixel 030 which are adjacent and are located in the different first pixel units PX1. Exemplarily, taking the first row in the first display region A1 for example, in the two adjacent first pixel units PX1, one isolating strip layer 141 is arranged between the first color sub-pixel 010 in one of the two first pixel units PX1 and the third color sub-pixel 030 in the other first pixel unit PX1. Exemplarily, a distance between a plane of one side, facing away from the base substrate 100, of the isolating strip layer 141 and the base substrate 100 is larger than a distance between a plane of one side, facing away from the base substrate 100, of a cathode layer and the base substrate 100.

Figure 3C:
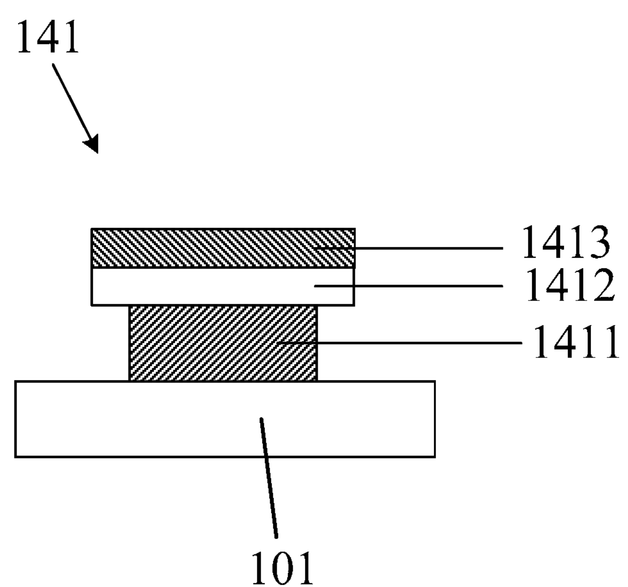
FIG. 3C is a schematic structural sectional view of an isolating strip layer in an embodiment of the present disclosure.

During specific implementation, in the embodiments of the present disclosure, as shown in FIG. 3C, each of the isolating strip layers 141 includes a first inorganic material layer 1411, an organic material layer 1412 and a second inorganic material layer 1413 arranged on the pixel defining layer 101 in sequence. Exemplarily, a material of the first inorganic material layer 1411 may include SiN, a material of the organic material layer 1412 may include resin, and a material of the second inorganic material layer 1413 may include SiO2. During preparation, the first inorganic material layer 1411 may be etched by using an etching process so that the isolating strip layer 141 can form a "T" shape.

During specific implementation, in the embodiments of the present disclosure, as shown in FIG. 2 and FIG. 4, one side, facing the second display region A2, of the first display region A1 has the cathode isolating portions 140 arranged around an edge of the first display region A1. In this way, the cathodes 133 in the first display region A1 can be separated from the cathodes 123 in the second display region A2 through the cathode isolating portions 140.

During specific implementation, in the embodiments of the present disclosure, as shown in FIG. 2, one side, facing the second display region A2, of the first display region A1 has the isolating strip layers 141 arranged around an edge of the first display region A1. Or, as shown in FIG. 4, in the row direction F2, the cathode inhibitor layers 142 are arranged between the second color sub-pixels 020 in the edge of the first display region A1 and the second display region A2, the isolating strip layers 141 are arranged between the third color sub-pixels 030 in the edge of the first display region A1 and the second display region A2, the isolating strip layers 141 are arranged between the first color sub-pixels 010 in the edge of the first display region A1 and the second display region A2, and in the column direction F1, the isolating strip layers 141 are arranged between the second color sub-pixels 020 in the edge of the first display region A1 and the second display region A2. Certainly, during actual application, it can be designed and determined according to actual application demands and will not be limited herein.

During specific implementation, in the embodiments of the present disclosure, as shown in FIG. 2 and FIG. 4, in the first display region A1, arrangement structures of the sub-pixels in each of the first pixel units PX1 are the same. In this way, the sub-pixels in the first pixel units PX1 can be uniformly arranged so that the cathode inhibitor layers 142 and the cathode isolating portions 140 can be also arranged uniformly.

During specific implementation, in the embodiments of the present disclosure, as shown in FIG. 2 and FIG. 4, in the second display region A2, arrangement structures of the sub-pixels in each of the second pixel units PX2 are the same. In this way, the sub-pixels in the second pixel units PX2 can be uniformly arranged.

During specific implementation, in the embodiments of the present disclosure, as shown in FIG. 2 and FIG. 4, the light-emitting area of one of the first color sub-pixels 010 in the first display region A1 may be larger than the light-emitting area of one of the fourth color sub-pixels 040 in the second display region A2. In this way, brightness of the first color sub-pixels 010 in the first display region A1 can be improved. Or, the light-emitting area of one of the first color sub-pixels 010 in the first display region A1 may be approximately equal to the light-emitting area of one of the fourth color sub-pixels 040 in the second display region A2. During actual application, it can be designed and determined according to actual application demands and will not be limited herein.

During specific implementation, in the embodiments of the present disclosure, as shown in FIG. 2 and FIG. 4, the light-emitting area of one of the second color sub-pixels 020 in the first display region A1 may be larger than the light-emitting area of one fifth color sub-pixel (such as 050-1 or 050-2) in the second display region A2. In this way, brightness of the second color sub-pixels 020 on the first display region A1 can be improved. Or, the light-emitting area of one of the second color sub-pixels 020 in the first display region A1 may be approximately equal to the light-emitting area of one fifth color sub-pixel (such as 050-1 or 050-2) in the second display region A2. During actual application, it can be designed and determined according to actual application demands and will not be limited herein.

During specific implementation, in the embodiments of the present disclosure, as shown in FIG. 2 and FIG. 4, the light-emitting area of one of the third color sub-pixels 030 in the first display region A1 may be larger than the light-emitting area of the sixth color sub-pixels 060 in the second display region A2. In this way, brightness of the third color sub-pixels 030 in the first display region A1 can be improved. Or, the light-emitting area of one of the third color sub-pixels 030 in the first display region A1 may be approximately equal to the light-emitting area of the sixth color sub-pixels 060 in the second display region A2. During actual application, it can be designed and determined according to actual application demands and will not be limited herein.

During specific implementation, in the embodiments of the present disclosure, as shown in FIG. 2 and FIG. 4, the second color sub-pixels 020 in the first display region A1 and the part of the fifth color sub-pixels (such as 050-1 and 050-2) in the second display region A2 may be located in the same column. Accordingly, the second color sub-pixels 020 in the first display region A1 and the fifth color sub-pixels (such as 050-1 and 050-2) in the second display region A2 are equivalently in correspondence in the column direction F1 instead of being dislocated or staggered, so that design difficulty of the second color sub-pixels 020 in the first display region A1 can be lowered.

During specific implementation, in the embodiments of the present disclosure, as shown in FIG. 2 and FIG. 4, the sub-pixels in the second sub-display region and part of the sub-pixels in the first sub-display region may be located in the same row. In this way, the sub-pixels in the first display region A1 and the sub-pixels in the second display region A2 are equivalently in correspondence in the row direction F2 instead of being dislocated or staggered, so that design difficulty of the sub-pixels in the first display region A1 can be lowered.

During specific implementation, in the embodiments of the present disclosure, as shown in FIG. 2 and FIG. 4, in the first display region A1, a distance of each of the cathode inhibitor layers 142 in the column direction F1 may be larger than a distance of the light-emitting region of one of the second color sub-pixels 020 in the column direction F1, and a distance of each cathode inhibitor layer 142 in the column direction F1 is smaller than a distance between centers of the light-emitting regions of the two adjacent first color sub-pixels 010 in the column direction F1. Certainly, during actual application, it can be designed and determined according to actual application demands and will not be limited herein.

During specific implementation, in the embodiments of the present disclosure, as shown in FIG. 4, a distance of each of the cathode inhibitor layers 142 in the row direction F2 is approximately equal to a distance between a center of the light-emitting region of the fourth color sub-pixel 040 and a center of the light-emitting region of the sixth color sub-pixel 060 in the same second pixel unit PX2. Or, a distance of each of the cathode inhibitor layers 142 in the row direction F2 may be larger than the distance between the center of the light-emitting region of the fourth color sub-pixel 040 and the center of the light-emitting region of the sixth color sub-pixel 060 in the same second pixel unit PX2.

Certainly, during actual application, it can be designed and determined according to actual application demands and will not be limited herein.

During specific implementation, in the embodiments of the present disclosure, as shown in FIG. 4, a distance of each of the cathode inhibitor layers 142 in the column direction F1 may be approximately equal to a minimum distance between the light-emitting regions of the two adjacent fourth color sub-pixels 040 in the second display region A2 in the column direction F1, and the distance of each cathode inhibitor layer 142 in the column direction F1 is smaller than a distance between centers of the light-emitting regions of the two adjacent fourth color sub-pixels 040 in the second display region A2 in the column direction F1. Or, a distance of each of the cathode inhibitor layers 142 in the column direction F1 may be larger than the minimum distance between the light-emitting regions of the two adjacent fourth color sub-pixels 040 in the second display region A2 in the column direction F1, and the distance of each cathode inhibitor layer 142 in the column direction F1 is smaller than a distance between centers of the light-emitting regions of the two adjacent fourth color sub-pixels 040 in the second display region A2 in the column direction F1. Certainly, during actual application, it can be designed and determined according to actual application demands and will not be limited herein.

It needs to be noted that in an actual process, due to limit of process conditions or other factors, "equal" in the above features is not "completely equal", and some deviations may exist, so an equal relation between the above features just approximately meets the above conditions, which fall within the protection scope of the present disclosure. For example, the above "equal" may be "equal" allowed within an allowed error range.

An embodiment of the present disclosure further provides a driving method of the above display panel, which may include:

in a first display mode, driving passive light-emitting devices 130 in the first display region A1 to emit light so as to make the first display region A1 display an image, and controlling pixel circuits in a second display region A2 to work, so as to make the pixel circuits drive active light-emitting devices 120 electrically connected therewith to emit light and then make the second display region A2 display an image;

in a second display mode, driving the passive light-emitting devices 130 in the first display region A1 to emit light, so as to make the first display region A1 display the image and make the second display region A2 not emit light; and in a third display mode, controlling the pixel circuits in the second display region A2 to work so as to make the pixel circuits drive the active light-emitting devices 120 electrically connected therewith to emit light and then make the second display region A2 display the image and the first display region A1 not emit light.

Exemplarily, the driving the passive light-emitting devices 130 in the first display region A1 to emit light may specifically include: driving the passive light-emitting devices 130 in the first display region A1 column by column to emit light.

Exemplarily, the controlling the pixel circuits in the second display region A2 to work so as to make the pixel circuits drive the active light-emitting devices 120 electrically connected therewith to emit light may specifically include: controlling the pixel circuits in the second display region A2 row by row to work so as to make the pixel circuits drive the active light-emitting devices 120 electrically connected therewith to emit light.

Exemplarily, in the first display mode, both the first display region A1 and the second display region A2 in the display panel can display the image. Besides, in the second display mode, only the first display region A1 can display the image. In the third display mode, only the second display region A2 can display the image, so that partitioning of the display region can be realized.

Exemplarily, time, a battery level, a name of a network operator, network signal intensity, pushed icons, etc. can be displayed in the first display region A1. A motional picture, a picture with a high requirement for definition, etc. can be displayed in the second display region A2. Certainly, during actual application, the first display region A1 and the second display region A2 can be driven to display types of pictures needing to be displayed according to demands for the pictures needing to be displayed actually, which will not be repeated in detail herein.

Figure 6:
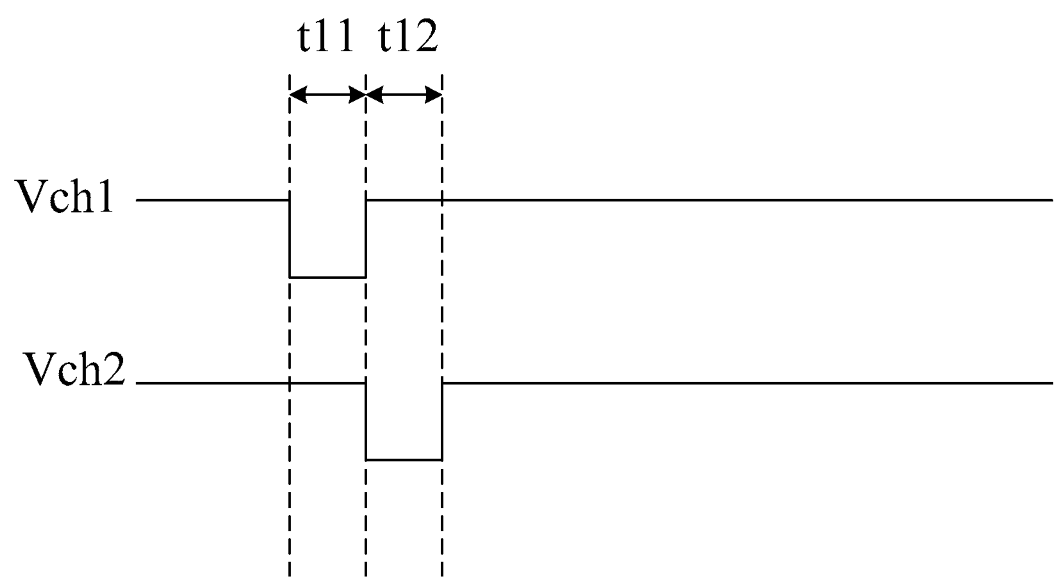
FIG. 6 is a sequence chart of some signals provided by an embodiment of the present disclosure.

Taking a structure of the display panel shown in FIG. 7A for example below, with reference to a signal sequence chart shown in FIG. 6, a driving process of the above display panel provided by the embodiments of the present disclosure is described by using specific embodiments.

In the first display mode, the passive light-emitting devices 130 in each of first sub-display regions are driven column by column respectively to emit light so as to make the first display region A1 display the image. The pixel circuits in the second display region A2 are controlled row by row to work so as to make the pixel circuits drive the active light-emitting devices 120 electrically connected therewith to emit light and then make the second display region A2 display the image. During actual application, a working process that the pixel circuits in the second display region A2 are controlled row by row to work so as to make the pixel circuits drive the active light-emitting devices 120 electrically connected therewith to emit light, may be basically the same as a working process in the related art and will not be repeated in detail herein. A working process of only the first display region A1 is described below. Besides, a first column and a second column in the first sub-display region A11 are taken for example, and so on, and the others are similar to this and will not be repeated in detail herein. Vch1 represents a signal input into cathodes of the passive light-emitting devices 130 in the first column of first pixel units PX1 in the first sub-display region A11 through the first driving line 210-A11. Vch2 represents a signal input into cathodes of the passive light-emitting devices 130 in the second column of first pixel units PX1 in the first sub-display region A11 through the first driving line 210-A11.

In a period t11, in the first sub-display region A11, the signal Vch1 input into the cathodes of the passive light-emitting devices 130 in the first column of first pixel units PX1 is a low level, the signal Vch2 input into the cathodes of the passive light-emitting devices 130 in the second column of first pixel units PX1 is a high level, and corresponding display signals are input into anodes of the passive light-emitting devices 130 in each row of sub-pixels, so that each of the passive light-emitting devices 130 in the first column of first pixel units PX1 can emit light and the passive light-emitting devices 130 in the second column of first pixel units PX1 cannot emit light.

In a period t12, in the first sub-display region A11, the signal Vch2 input into the cathodes of the passive light-emitting devices 130 in the second column of first pixel units PX1 is the low level, the signal Vch1 input into the cathodes of the passive light-emitting devices 130 in the first column of first pixel units PX1 is the high level, and corresponding display signals are input into anodes of the passive light-emitting devices 130 in each row of sub-pixels, so that each of the passive light-emitting devices 130 in the second column of first pixel units PX1 can emit light and the passive light-emitting devices 130 in the first column of first pixel units PX1 cannot emit light.

Besides, based on a visual persistence effect of human eyes, the first sub-display region A11 can realize an image display function.

In the second display mode, the passive light-emitting devices 130 in each of the first sub-display regions are driven column by column respectively to emit light so as to make the first display region A1 display the image. The working process in the first display region A1 in the second display mode is basically the same as the working process in the first display region A1 in the first display mode and will not be repeated in detail herein.

In the third display mode, the pixel circuits in the second display region A2 are controlled row by row to work so as to make the pixel circuits drive the active light-emitting devices 120 electrically connected therewith to emit light and then make only the second display region A2 display the image. During actual application, a working process that the pixel circuits in the second display region A2 are controlled row by row to work so as to make the pixel circuits drive the active light-emitting devices 120 electrically connected therewith to emit light may be basically the same as the working process in the related art and will not be repeated in detail herein.

Optionally, the embodiment of the present disclosure further provides the driving method of the above display panel. The driving the passive light-emitting devices 130 in the first display region A1 to emit light so as to make the first display region A1 display the image may specifically include: driving the passive light-emitting devices 130 in each of the first sub-display regions column by column at the same time so as to make the passive light-emitting devices 130 in each of the first sub-display regions to emit light column by column.

During specific implementation, in the first display mode, the passive light-emitting devices 130 in each of the first sub-display regions are driven column by column so as to make the passive light-emitting devices 130 in each of the first sub-display regions emit light column by column, and the pixel circuits in the second display region A2 are controlled to work so as to make the pixel circuits drive the active light-emitting devices 120 electrically connected therewith to emit light and then make the second display region A2 display the image.

During specific implementation, in the second display mode, the passive light-emitting devices 130 in each of the first sub-display regions are driven column by column so as to make the passive light-emitting devices 130 in each of the first sub-display regions emit light column by column.

During specific implementation, in the third display mode, the pixel circuits in the second display region A2 are controlled to work so as to make the pixel circuits drive the active light-emitting devices 120 electrically connected therewith to emit light and then make the second display region A2 display the image.

Figure 8:
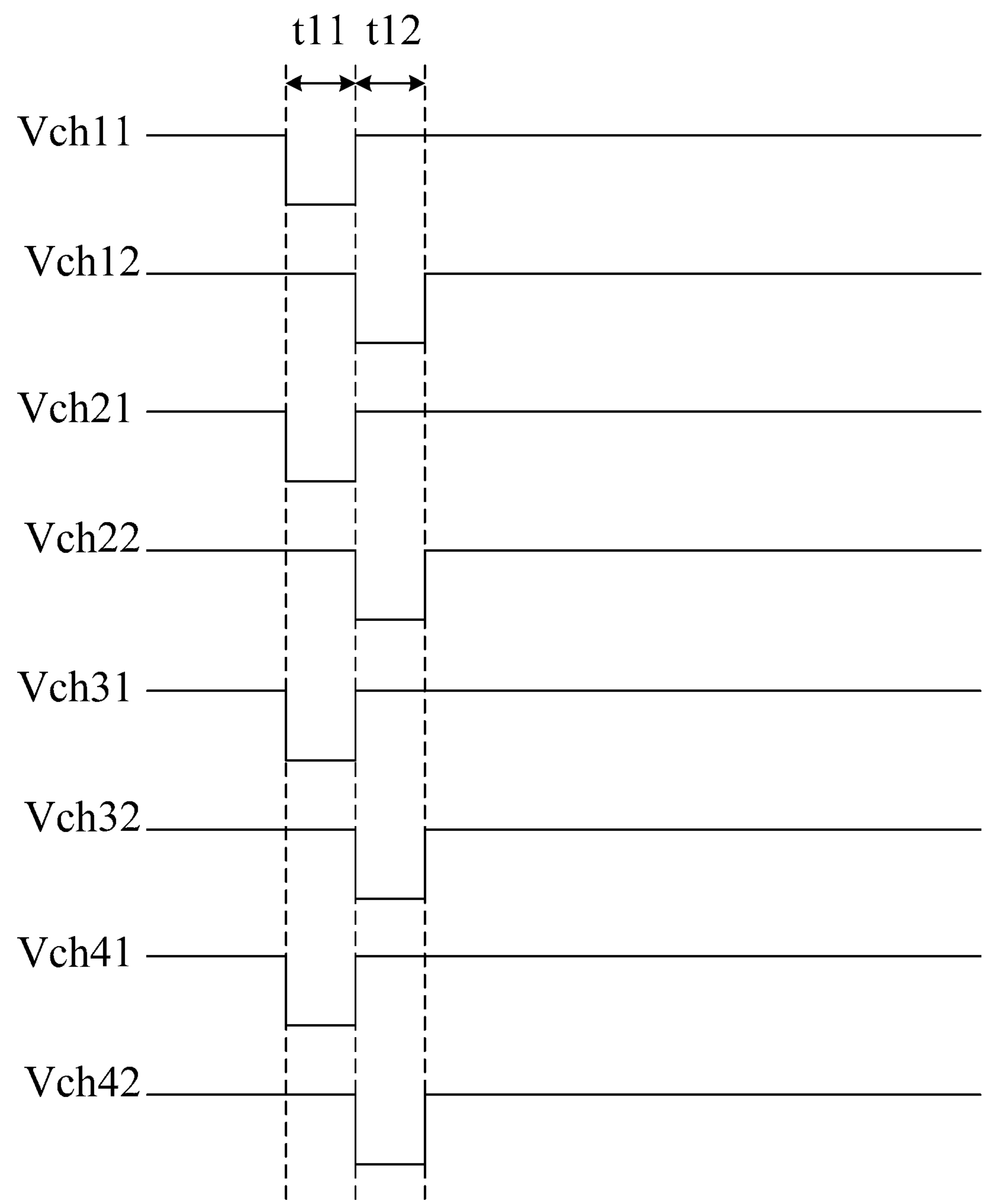
FIG. 8 is a sequence chart of some other signals provided by an embodiment of the present disclosure.

Taking the structure of the display panel shown in FIG. 7A for example below, with reference to a signal sequence chart shown in FIG. 8, the driving process of the above display panel provided by the embodiments of the present disclosure is described by using specific embodiments.

Vch11 represents a signal input into the cathodes of the passive light-emitting devices 130 in the first column of first pixel units PX1 in the first sub-display region A11 through the first driving line 210-A11. Vch12 represents a signal input into the cathodes of the passive light-emitting devices 130 in the second column of first pixel units PX1 in the first sub-display region A11 through the first driving line 210-A11.

Vch21 represents a signal input into cathodes of the passive light-emitting devices 130 in the first column of first pixel units PX1 in the first sub-display region A12 through the first driving line 210-A12. Vch22 represents a signal input into cathodes of the passive light-emitting devices 130 in the second column of first pixel units PX1 in the first sub-display region A12 through the first driving line 210-A12.

Vch31 represents a signal input into cathodes of the passive light-emitting devices 130 in the first column of first pixel units PX1 in the first sub-display region A13 through the first driving line 210-A13. Vch32 represents a signal input into cathodes of the passive light-emitting devices 130 in the second column of first pixel units PX1 in the first sub-display region A13 through the first driving line 210-A13.

Vch41 represents a signal input into cathodes of the passive light-emitting devices 130 in the first column of first pixel units PX1 in the first sub-display region A14 through the first driving line 210-A14. Vch42 represents a signal input into cathodes of the passive light-emitting devices 130 in the second column of first pixel units PX1 in the first sub-display region A14 through the first driving line 210-A14.

In the first display mode, the passive light-emitting devices 130 in each of the first sub-display regions are driven column by column at the same time to emit light so as to make the first display region A1 display the image. The pixel circuits in the second display region A2 are controlled row by row to work so as to make the pixel circuits drive the active light-emitting devices 120 electrically connected therewith to emit light and then make the second display region A2 display the image. During actual application, the working process that the pixel circuits in the second display region A2 are controlled row by row to work so as to make the pixel circuits drive the active light-emitting devices 120 electrically connected therewith to emit light, may be basically the same as the working process in the related art and will not be repeated in detail herein. The working process of only the first display region A1 is described below. Besides, the first column and the second column in the first sub-display regions A11, A12, A13 and A14 are taken for example, and so on, and the others are similar to this and will not be repeated in detail herein.

In the period t11, in the first sub-display region A11, the signal Vch11 input into the cathodes of the passive light-emitting devices 130 in the first column of first pixel units PX1 is the low level, the signal Vch12 input into the cathodes of the passive light-emitting devices 130 in the second column of first pixel units PX1 is the high level, and the corresponding display signals are input into the anodes of the passive light-emitting devices 130 in each row of sub-pixels of the first sub-display region A11, so that each of the passive light-emitting devices 130 in the first column of first pixel units PX1 of the first sub-display region A11 can emit light and the passive light-emitting devices 130 in the second column of first pixel units PX1 cannot emit light.

Besides, in the first sub-display region A12, the signal Vch21 input into the cathodes of the passive light-emitting devices 130 in the first column of first pixel units PX1 is the low level, the signal Vch22 input into the cathodes of the passive light-emitting devices 130 in the second column of first pixel units PX1 is the high level, and the corresponding display signals are input into the anodes of the passive light-emitting devices 130 in each row of sub-pixels of the first sub-display region A12, so that each of the passive light-emitting devices 130 in the first column of first pixel units PX1 of the first sub-display region A12 can emit light and the passive light-emitting devices 130 in the second column of first pixel units PX1 cannot emit light.

Besides, in the first sub-display region A13, the signal Vch31 input into the cathodes of the passive light-emitting devices 130 in the first column of first pixel units PX1 is the low level, the signal Vch32 input into the cathodes of the passive light-emitting devices 130 in the second column of first pixel units PX1 is the high level, and the corresponding display signals are input into the anodes of the passive light-emitting devices 130 in each row of sub-pixels of the first sub-display region A13, so that each of the passive light-emitting devices 130 in the first column of first pixel units PX1 of the first sub-display region A13 can emit light and the passive light-emitting devices 130 in the second column of first pixel units PX1 cannot emit light.

Besides, in the first sub-display region A14, the signal Vch41 input into the cathodes of the passive light-emitting devices 130 in the first column of first pixel units PX1 is the low level, the signal Vch42 input into the cathodes of the passive light-emitting devices 130 in the second column of first pixel units PX1 is the high level, and the corresponding display signals are input into the anodes of the passive light-emitting devices 130 in each row of sub-pixels of the first sub-display region A14, so that each of the passive light-emitting devices 130 in the first column of first pixel units PX1 of the first sub-display region A14 can emit light and the passive light-emitting devices 130 in the second column of first pixel units PX1 cannot emit light.

In the period t12, in the first sub-display region A11, the signal Vch12 input into the cathodes of the passive light-emitting devices 130 in the second column of first pixel units PX1 is the low level, the signal Vch11 input into the cathodes of the passive light-emitting devices 130 in the first column of first pixel units PX1 is the high level, and the corresponding display signals are input into the anodes of the passive light-emitting devices 130 in each row of sub-pixels in the first sub-display region A11, so that each of the passive light-emitting devices 130 in the second column of first pixel units PX1 of the first sub-display region A11 can emit light and the passive light-emitting devices 130 in the first column of first pixel units PX1 cannot emit light.

Besides, in the first sub-display region A12, the signal Vch22 input into the cathodes of the passive light-emitting devices 130 in the second column of first pixel units PX1 is the low level, the signal Vch21 input into the cathodes of the passive light-emitting devices 130 in the first column of first pixel units PX1 is the high level, and the corresponding display signals are input into the anodes of the passive light-emitting devices 130 in each row of sub-pixels of the first sub-display region A12, so that each of the passive light-emitting devices 130 in the second column of first pixel units PX1 of the first sub-display region A12 can emit light and the passive light-emitting devices 130 in the first column of first pixel units PX1 cannot emit light.

Besides, in the first sub-display region A13, the signal Vch32 input into the cathodes of the passive light-emitting devices 130 in the second column of first pixel units PX1 is the low level, the signal Vch31 input into the cathodes of the passive light-emitting devices 130 in the first column of first pixel units PX1 is the high level, and the corresponding display signals are input into the anodes of the passive light-emitting devices 130 in each row of sub-pixels of the first sub-display region A13, so that each of the passive light-emitting devices 130 in the second column of first pixel units PX1 of the first sub-display region A13 can emit light and the passive light-emitting devices 130 in the first column of first pixel units PX1 cannot emit light.

Besides, in the first sub-display region A14, the signal Vch42 input into the cathodes of the passive light-emitting devices 130 in the second column of first pixel units PX1 is the low level, the signal Vch41 input into the cathodes of the passive light-emitting devices 130 in the first column of first pixel units PX1 is the high level, and the corresponding display signals are input into the anodes of the passive light-emitting devices 130 in each row of sub-pixels of the first sub-display region A14, so that each of the passive light-emitting devices 130 in the second column of first pixel units PX1 of the first sub-display region A14 can emit light and the passive light-emitting devices 130 in the first column of first pixel units PX1 cannot emit light.

Besides, based on a visual persistence effect of human eyes, the first display region A1 can realize an image display function.

In the second display mode, the passive light-emitting devices 130 in each of the first sub-display regions are driven column by column at the same time to emit light so as to make only the first display region A1 display the image. The working process of the first display region A1 in the second display mode is basically the same as the working process of the first display region A1 in the first display mode and will not be repeated in detail herein.

In the third display mode, the pixel circuits in the second display region A2 are controlled row by row to work so as to make the pixel circuits drive the active light-emitting devices 120 electrically connected therewith to emit light and then make only the second display region A2 display the image. During actual application, the working process that the pixel circuits in the second display region A2 are controlled row by row to work so as to make the pixel circuits drive the active light-emitting devices 120 electrically connected therewith to emit light, may be basically the same as the working process in the related art and will not be repeated in detail herein.

An embodiment of the present disclosure further provides a display apparatus, including the above display panel provided by the embodiment of the present disclosure. A principle of solving problems of the display apparatus is similar to that of the above mentioned display panel, so implementation of the display apparatus may refer to implementation of the above mentioned display panel, and repetitions are omitted herein.

Figure 9:
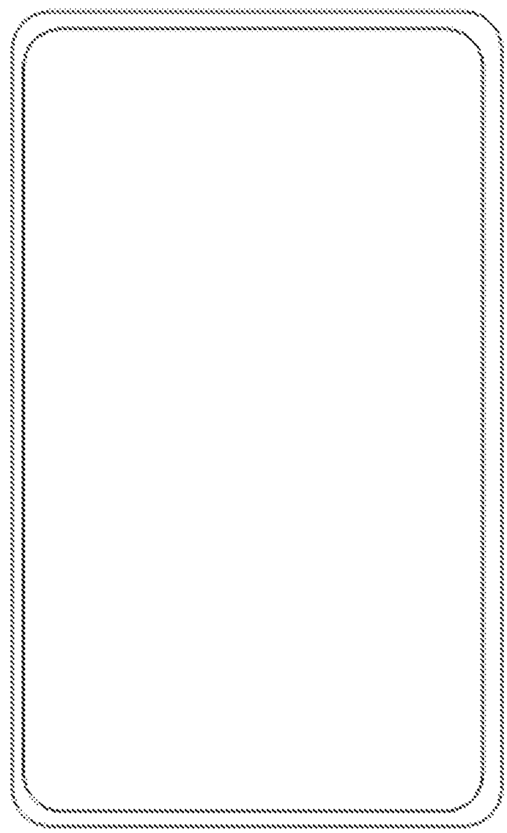
FIG. 9 is a schematic structural diagram of some display apparatuses provided by an embodiment of the present disclosure.

During specific implementation, the above display apparatus provided by the embodiment of the present disclosure may be a full screen mobile phone shown in FIG. 9. Certainly, the display apparatus provided by the embodiment of the present disclosure may also be a tablet computer, a TV, a display, a laptop, a digital photo frame, a navigator and any product or component with a display function. Other essential components of the display apparatus should be understood by those of ordinary skill in the art, which is neither repeated in detail herein nor supposed to limit the present disclosure.

According to the display panel, the driving method and the display apparatus provided by the embodiments of the present disclosure, the active light-emitting devices can be controlled by using the independent pixel circuits, and thus each of the active light-emitting devices can emit light continuously and independently. Therefore, by arranging the pixel circuit layer with the pixel circuits and the active light-emitting devices in the second display region and electrically connecting the pixel circuits with the active light-emitting devices, the pixel circuits can be adopted to drive the active light-emitting devices to emit light in the second display region so that the second display region can realize the display function. Besides, the passive light-emitting devices but not the pixel circuits are arranged in the first display region, so that not only can the first display region realize the display function by using the passive light-emitting devices to emit light, but also a light transmittance can be higher by making the first display region free of the pixel circuits and metal routing wires. In this way, when the display panel is applied to the display apparatus, the front camera, the sensor, the receiver and other elements may be arranged below the first display region of the display panel, so that the design of the full screen can be realized and a screen-to-body ratio can be increased.

Besides, in the embodiments of the present disclosure, the cathode isolating portions are arranged between the cathodes of the at least two adjacent columns of the passive light-emitting devices, so that during preparation, after the cathode isolating portions are covered with the cathodes, the cathodes can be automatically separated at the cathode isolating portions, and thus the cathodes of the two adjacent columns of the passive light-emitting devices are separated.

Though the preferable embodiments of the present disclosure are already described, those skilled in the art can make extra changes and modifications for these embodiments once they know the basic inventive concept. Therefore, the appended claims intend to be constructed as including the preferable embodiments and all the changes and modifications falling within the scope of the present disclosure.

Apparently, those skilled in the art can make various changes and transformations for the embodiments of the present disclosure without departing from the spirit and the scope of the embodiments of the present disclosure. In this case, if these changes and transformations of the embodiments of the present disclosure fall within the scope of the claims and their equivalents of the present disclosure, the present disclosure also intends to include these changes and transformations.

Apparently, those skilled in the art can make various changes and transformations for the present disclosure without departing from the spirit and the scope of the present disclosure. In this case, if these changes and transformations of the present disclosure fall within the scope of the claims and their equivalents of the present disclosure, the present disclosure also intends to include these changes and transformations.

What is claimed is:

1. A display panel, having a first display region and a second display region and comprising:

a base substrate;

a pixel circuit layer on the base substrate, wherein the pixel circuit layer is arranged in the second display region and comprises a plurality of pixel circuits; and a light-emitting device layer, arranged on one side, facing away from the base substrate, of the pixel circuit layer;

wherein the light-emitting device layer comprises a plurality of active light-emitting devices and a plurality of passive light-emitting devices; the plurality of active light-emitting devices are arranged in the second display region; each of the plurality of pixel circuits is electrically connected with at least one of the plurality of active light-emitting devices; and the plurality of passive light-emitting devices are arranged in the first display region in an array mode;

wherein the first display region comprises: a plurality of first sub-display regions which are configured to be driven separately to make the first display region display an image;

wherein each of the plurality of first sub-display regions further comprises: a plurality of first driving lines and a plurality of second driving lines;

wherein cathodes of passive light-emitting devices in one column are electrically connected with one of the plurality of first driving lines; anodes of passive light-emitting devices in one row are electrically connected with one of the plurality of second driving lines; and the second driving lines in different first sub-display regions are arranged at intervals;

wherein the display panel further comprises: a plurality of first pixel units arranged in an array mode in the first display region; wherein the first pixel units comprise first color sub-pixels, second color sub-pixels and third color sub-pixels; and one of the passive light-emitting devices is arranged in each of the first color sub-pixels, the second color sub-pixels and the third color sub-pixels in the first display region respectively;

anodes of the passive light-emitting devices in a same color sub-pixel in one row are electrically connected with one of the plurality of second driving lines; the cathodes of the passive light-emitting devices in one column of the first pixel units are electrically connected with one of the plurality of first driving lines; and signals input into the first driving lines of each of the first sub-display regions at a same moment are identical, and signals input into the second driving lines of each of the first sub-display regions at a same moment are identical.

2. The display panel according to claim 1, further comprising: a plurality of cathode isolating portions arranged in the first display region;

wherein the cathode isolating portions are arranged between cathodes of at least two adjacent columns of passive light-emitting devices, to separate the cathodes of the at least two adjacent columns of passive light-emitting devices.

3. The display panel according to claim 2, wherein each of the cathode isolating portions has at least one isolating strip layer;

a section of each of the at least one isolating strip layer in an extending direction perpendicular to the each cathode isolating portion has a first side close to the base substrate and a second side far away from the base substrate; and a distance of the second side is larger than that of the first side.

4. The display panel according to claim 3, wherein the each cathode isolating portion comprises a plurality of isolating strip layers arranged at intervals;

the each cathode isolating portion further comprises: a plurality of cathode inhibitor layers arranged at intervals; and in a same cathode isolating portion, orthographic projections of the plurality of cathode inhibitor layers on the base substrate and orthographic projections of the plurality of isolating strip layers on the base substrate are arranged alternately.

5. The display panel according to claim 4, wherein the light-emitting device layer comprises:

a first electrode layer, arranged on the side, facing away from the base substrate, of the pixel circuit layer; wherein the first electrode layer comprises anodes of the active light-emitting devices and the anodes of the passive light-emitting devices;

a pixel defining layer, arranged on one side, facing away from the base substrate, of the first electrode layer; wherein the pixel defining layer has a plurality of openings, and an orthographic projection of one of the openings on the base substrate is arranged in an orthographic projection of one of the anodes on the base substrate;

a light-emitting function layer, arranged on one side, facing away from the base substrate, of the pixel defining layer, wherein an orthographic projection of the light-emitting function layer on the base substrate covers orthographic projections of the plurality of openings on the base substrate; and a second electrode layer, arranged on one side, facing away from the base substrate, of the light-emitting function layer; wherein the second electrode layer comprises cathodes of the active light-emitting devices and the cathodes of the passive light-emitting devices;

wherein the plurality of isolating strip layers are arranged between the pixel defining layer and the light-emitting function layer, and an orthographic projection of the pixel defining layer on the base substrate covers orthographic projections of the plurality of isolating strip layers on the base substrate; and the plurality of cathode inhibitor layers are arranged between the light-emitting function layer and the second electrode layer, and the orthographic projection of the pixel defining layer on the base substrate covers orthographic projections of the plurality of cathode inhibitor layers on the base substrate.

6. The display panel according to claim 5, wherein in a same first pixel unit, the first color sub-pixel and the third color sub-pixel are arranged in a same row, and the second color sub-pixel is arranged in a row adjacent to the row where the first color sub-pixel and the third color sub-pixel are arranged;

in the first display region, rows where the first color sub-pixels are arranged and rows where the second color sub-pixels are arranged are arranged alternately in a column direction;

in a same row of the first display region, a cathode inhibitor layer is arranged between every two adjacent second color sub-pixels; and in the same row of the first display region, an isolating strip layer is arranged between the first color sub-pixel and the third color sub-pixel which are adjacent and arranged in different first pixel units.

7. The display panel according to claim 6, wherein cathode isolating portions which are arranged around an edge of the first display region are arranged on one side, facing the second display region, of the first display region; and/or in a row direction, cathode inhibitor layers are arranged between the second color sub-pixels in the edge of the first display region and the second display region, isolating strip layers are arranged between the third color sub-pixels in the edge of the first display region and the second display region, and isolating strip layers are arranged between the first color sub-pixels in the edge of the first display region and the second display region; and in the column direction, isolating strip layers are arranged between the second color sub-pixels in the edge of the first display region and the second display region.

8. The display panel according to claim 3, wherein the section of the each isolating strip layer in an extending direction perpendicular to the each cathode isolating portion is in a “T” shape or an inverted trapezoidal shape.

9. The display panel according to claim 1, further comprising: a plurality of second pixel units in the second display region, wherein each of the second pixel units comprises a fourth color sub-pixel, two fifth color sub-pixels and a sixth color sub-pixel, wherein one active light-emitting device and one pixel circuit are arranged in each of the fourth color sub-pixel, the fifth color sub-pixels and the sixth color sub-pixel in the second display region respectively;

a distance of a cathode inhibitor layer in a row direction is larger than or equal to a distance between a center of a light-emitting region of the fourth color sub-pixel and a center of a light-emitting region of the sixth color sub-pixel in a same second pixel unit;

a distance of the cathode inhibitor layer in a column direction is larger than or equal to a minimum distance between light-emitting regions of two adjacent fourth color sub-pixels in the second display region in the column direction, and the distance of the cathode inhibitor layer in the column direction is smaller than a distance between centers of the light-emitting regions of the two adjacent fourth color sub-pixels in the second display region in the column direction; and/or a light-emitting area of one of the first color sub-pixels in the first display region is larger than or equal to a light-emitting area of one fourth color sub-pixel in the second display region;

a light-emitting area of one of the second color sub-pixels in the first display region is larger than or equal to a light-emitting area of at least one of the two fifth color sub-pixels in the second display region; and a light-emitting area of one of the third color sub-pixels in the first display region is larger than or equal to a light-emitting area of one sixth color sub-pixel in the second display region.

10. The display panel according to claim 1, wherein a pixel distribution density in the first display region is smaller than a pixel distribution density in the second display region.

11. A display apparatus, comprising the display panel according to claim 1.

12. The display apparatus according to claim 11, wherein each of the plurality of first sub-display regions further comprises: a plurality of first driving lines and a plurality of second driving lines;

wherein cathodes of passive light-emitting devices in one column are electrically connected with one of the plurality of first driving lines;

anodes of passive light-emitting devices in one row are electrically connected with one of the plurality of second driving lines; and the second driving lines in different first sub-display regions are arranged at intervals.

13. The display apparatus according to claim 12, wherein the first display region comprises a plurality of first pixel units arranged in an array mode; the first pixel units comprise first color sub-pixels, second color sub-pixels and third color sub-pixels; and one of the passive light-emitting devices is arranged in each of the first color sub-pixels, the second color sub-pixels and the third color sub-pixels in the first display region respectively;

anodes of the passive light-emitting devices in a same color sub-pixel in one row are electrically connected with one of the plurality of second driving lines; the cathodes of the passive light-emitting devices in one column of the first pixel units are electrically connected with one of the plurality of first driving lines; and signals input into the first driving lines of each of the first sub-display regions at a same moment are identical, and signals input into the second driving lines of each of the first sub-display regions at a same moment are identical.

14. The display apparatus according to claim 13, further comprising: a plurality of cathode isolating portions arranged in the first display region;

wherein the cathode isolating portions are arranged between cathodes of at least two adjacent columns of passive light-emitting devices, to separate the cathodes of the at least two adjacent columns of passive light-emitting devices.

15. The display apparatus according to claim 14, wherein each of the cathode isolating portions has at least one isolating strip layer;

a section of each of the at least one isolating strip layer in an extending direction perpendicular to the each cathode isolating portion has a first side close to the base substrate and a second side far away from the base substrate; and a distance of the second side is larger than that of the first side.

16. The display apparatus according to claim 15, wherein the each cathode isolating portion comprises a plurality of isolating strip layers arranged at intervals;

the each cathode isolating portion further comprises: a plurality of cathode inhibitor layers arranged at intervals; and in a same cathode isolating portion, orthographic projections of the plurality of cathode inhibitor layers on the base substrate and orthographic projections of the plurality of isolating strip layers on the base substrate are arranged alternately.

17. A driving method of the display panel according to claim 1, comprising:

in a first display mode, driving the passive light-emitting devices in the first display region to emit light to make the first display region display an image, and controlling the pixel circuits in the second display region to work to make the pixel circuits drive the active light-emitting devices electrically connected therewith to emit light and then make the second display region display an image;

in a second display mode, driving the passive light-emitting devices in the first display region to emit light to make the first display region display the image and make the second display region not emit light; and in a third display mode, controlling the pixel circuits in the second display region to work to make the pixel circuits drive the active light-emitting devices electrically connected therewith to emit light and then make the second display region display the image and make the first display region not emit light.

18. The driving method according to claim 17, wherein the driving the passive light-emitting devices in the first display region to emit light to make the first display region display the image, comprises:

driving the passive light-emitting devices in each of the plurality of first sub-display regions column by column simultaneously to make the passive light-emitting devices in each first sub-display region emit light column by column.

* * * * *